(12) United States Patent
Kwon et al.

(10) Patent No.: US 12,193,294 B2
(45) Date of Patent: Jan. 7, 2025

(54) DISPLAY APPARATUS AND MULTI-PANEL ORGANIC LIGHT EMITTING DISPLAY DEVICE INCLUDING THE SAME

(71) Applicant: LG Display Co., Ltd., Seoul (KR)

(72) Inventors: OhJong Kwon, Suwon-si (KR); ChangHo Oh, Seoul (KR); HyeonWoo Lee, Paju-si (KR); YoungJun Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/180,026

(22) Filed: Mar. 7, 2023

(65) Prior Publication Data

US 2023/0225167 A1 Jul. 13, 2023

Related U.S. Application Data

(63) Continuation of application No. 17/168,022, filed on Feb. 4, 2021, now Pat. No. 11,626,468, which is a
(Continued)

(30) Foreign Application Priority Data

Jul. 3, 2018 (KR) .......................... 10-2018-0077281

(51) Int. Cl.
*H10K 59/13* (2023.01)
*H10K 59/131* (2023.01)
(Continued)

(52) U.S. Cl.
CPC ........... *H10K 59/131* (2023.02); *H10K 59/18* (2023.02); *G02F 1/13336* (2013.01);
(Continued)

(58) Field of Classification Search
CPC ........ H10K 50/15; H10K 50/16; H10K 50/17; H10K 50/171; H10K 50/818;
(Continued)

(56) References Cited

U.S. PATENT DOCUMENTS 6,624,570 B1 * 9/2003 Nishio .................... H05B 33/14
428/917
6,642,542 B1 * 11/2003 Shimoda ................. G09F 9/313
257/40
(Continued)

FOREIGN PATENT DOCUMENTS

DE 102016117976 A1 3/2017
EP 0537852 A1 4/1993
(Continued)

*Primary Examiner* — Ida M Soward
(74) *Attorney, Agent, or Firm* — Seed IP Law Group LLP

(57) ABSTRACT

A multi-panel organic light emitting display device is disclosed that includes a plurality of display panels coupled to each other. Each of the plurality of display panels includes: a substrate including an active area and a non-active area; and a display unit including an organic light emitting element on the substrate. Each of the plurality of display panels also includes: a plurality of signal lines disposed on the substrate and electrically connected to the display unit; and a plurality of link lines disposed under the substrate. Each of the plurality of display panels further includes a plurality of side lines connecting the plurality of signal lines and the plurality of link lines. Each of the plurality of display panels also includes a driving circuit electrically connected to the plurality of link lines.

22 Claims, 17 Drawing Sheets

Related U.S. Application Data continuation of application No. 16/503,059, filed on Jul. 3, 2019, now Pat. No. 10,943,969.

(51) Int. Cl.

| | | |
|---|---|---|
| *H10K 59/18* | (2023.01) | |
| *G02F 1/1333* | (2006.01) | |
| *G06F 3/14* | (2006.01) | |
| *G09F 9/302* | (2006.01) | |
| *H10K 50/15* | (2023.01) | |
| *H10K 50/16* | (2023.01) | |
| *H10K 50/17* | (2023.01) | |
| *H10K 50/818* | (2023.01) | |
| *H10K 50/828* | (2023.01) | |
| *H10K 50/842* | (2023.01) | |
| *H10K 50/844* | (2023.01) | |
| *H10K 59/121* | (2023.01) | |
| *H10K 59/127* | (2023.01) | |
| *H10K 59/128* | (2023.01) | |
| *H10K 59/176* | (2023.01) | |
| *H10K 59/35* | (2023.01) | |
| *H10K 77/10* | (2023.01) | |
| *H10K 102/00* | (2023.01) | |

(52) U.S. Cl.
CPC .......... *G06F 3/1446* (2013.01); *G09F 9/3026* (2013.01); *G09G 2300/026* (2013.01); *G09G 2300/0408* (2013.01); *G09G 2300/0804* (2013.01); *H10K 50/15* (2023.02); *H10K 50/16* (2023.02); *H10K 50/17* (2023.02); *H10K 50/171* (2023.02); *H10K 50/818* (2023.02); *H10K 50/828* (2023.02); *H10K 50/8426* (2023.02); *H10K 50/844* (2023.02); *H10K 59/121* (2023.02); *H10K 59/1216* (2023.02); *H10K 59/127* (2023.02); *H10K 59/1275* (2023.02); *H10K 59/128* (2023.02); *H10K 59/176* (2023.02); *H10K 59/35* (2023.02); *H10K 77/111* (2023.02); *H10K 2102/00* (2023.02); *H10K 2102/311* (2023.02)

(58) Field of Classification Search
CPC ............. H10K 50/828; H10K 50/8426; H10K 50/844; H10K 50/80; H10K 50/00; H10K 59/131; H10K 59/18; H10K 59/121; H10K 59/1216; H10K 59/127; H10K 59/1275; H10K 59/128; H10K 59/176; H10K 59/35; H10K 59/124; H10K 77/111; H10K 2102/00; H01L 27/153; G09G 2300/0408
See application file for complete search history.

(56) References Cited

U.S. PATENT DOCUMENTS

| | | | |
|---|---|---|---|
| 8,421,950 B2 | 4/2013 | Kim et al. | |
| 9,892,676 B2 * | 2/2018 | Cao | G09G 3/3225 |
| 10,180,700 B2 | 1/2019 | Jun et al. | |
| 10,247,988 B2 | 4/2019 | Ide et al. | |
| 10,278,295 B2 * | 4/2019 | Chin | G02F 1/13336 |
| 10,359,810 B2 | 7/2019 | Miyake et al. | |
| 10,401,560 B2 * | 9/2019 | Kawata | G02F 1/13452 |
| 10,462,554 B2 | 10/2019 | Ham et al. | |
| 10,551,700 B2 | 2/2020 | Lee et al. | |
| 10,754,204 B2 | 8/2020 | Momose et al. | |
| 2005/0030058 A1 * | 2/2005 | Li | G09G 3/006 |
| | | | 324/760.01 |
| 2005/0168490 A1 * | 8/2005 | Takahara | G09G 3/3241 |
| | | | 345/690 |
| 2006/0038752 A1 | 2/2006 | Winters | |
| 2009/0109369 A1 | 4/2009 | Morishita | |
| 2010/0123384 A1 * | 5/2010 | Miller | H10K 59/878 |
| | | | 313/498 |
| 2010/0164849 A1 * | 7/2010 | Lan | G09G 3/3659 |
| | | | 345/88 |
| 2010/0302285 A1 * | 12/2010 | Yamanaka | G09G 3/3233 |
| | | | 345/76 |
| 2011/0285607 A1 | 11/2011 | Kim | |
| 2012/0146886 A1 | 6/2012 | Minami et al. | |
| 2013/0200409 A1 | 8/2013 | Abe | |
| 2015/0097837 A1 | 4/2015 | Jepsen et al. | |
| 2015/0173176 A1 | 6/2015 | Lee | |
| 2015/0214502 A1 * | 7/2015 | Sato | H10K 50/8426 |
| | | | 438/28 |
| 2015/0230331 A1 | 8/2015 | Lee | |
| 2016/0014882 A1 * | 1/2016 | Jongman | G02F 1/13452 |
| | | | 156/247 |
| 2016/0154262 A1 * | 6/2016 | Cho | G02F 1/133308 |
| | | | 349/73 |
| 2016/0324013 A1 | 11/2016 | Lee et al. | |
| 2017/0031643 A1 | 2/2017 | Jeong | |
| 2017/0090634 A1 | 3/2017 | Yang et al. | |
| 2017/0148702 A1 | 5/2017 | Funayama et al. | |
| 2017/0169757 A1 * | 6/2017 | Kim | G09G 3/20 |
| 2017/0373272 A1 | 12/2017 | Son et al. | |
| 2018/0007789 A1 | 1/2018 | Kawata et al. | |
| 2018/0090698 A1 | 3/2018 | Jeong et al. | |
| 2018/0138447 A1 | 5/2018 | Jin et al. | |
| 2018/0173036 A1 * | 6/2018 | Kim | G02F 1/133524 |
| 2018/0188579 A1 * | 7/2018 | Jeong | G02F 1/13452 |
| 2018/0190631 A1 * | 7/2018 | Kim | H01L 25/162 |
| 2018/0190747 A1 * | 7/2018 | Son | G06F 3/1446 |
| 2018/0307084 A1 | 10/2018 | Lee et al. | |
| 2018/0331125 A1 * | 11/2018 | Wang | H01L 27/124 |
| 2019/0305073 A1 | 10/2019 | Chen et al. | |

FOREIGN PATENT DOCUMENTS

| | | | | |
|---|---|---|---|---|
| EP | 1416460 A1 | 5/2004 | | |
| EP | 3186834 A1 | 7/2017 | | |
| EP | 3296808 A1 | 3/2018 | | |
| EP | 3422827 A1 | 1/2019 | | |
| EP | 3753008 A1 | 12/2020 | | |
| JP | 2017090571 A | 5/2017 | | |
| KR | 20030041153 A | 5/2003 | | |
| KR | 20130109350 A | 10/2013 | | |
| KR | 20170026995 A * | 3/2017 | ....... | G02F 1/136286 |
| KR | 20170080266 A | 7/2017 | | |
| WO | WO-2015043317 A1 * | 4/2015 | ......... | G02F 1/13336 |

* cited by examiner

DISPLAY APPARATUS AND MULTI-PANEL ORGANIC LIGHT EMITTING DISPLAY DEVICE INCLUDING THE SAME

CROSS-REFERENCE TO RELATED APPLICATIONS

This application is a continuation of U.S. patent application Ser. No. 17/168,022, filed Feb. 4, 2021; which is a continuation of U.S. patent application Ser. No. 16/503,059, filed Jul. 3, 2019, which claims the priority of Korean Patent Application No. 10-2018-0077281 filed on Jul. 3, 2018, in the Korean Intellectual Property Office, the disclosure of which is incorporated herein by reference, in its entirety.

BACKGROUND

Technical Field

The present disclosure relates to a multi-panel organic light emitting display device including a plurality of display panels.

Description of the Related Art

Display devices have been developed that can represent information contained in electrical information signals in the form of visual images. Specific examples of the above-mentioned display devices include a liquid crystal display device (LCD), a plasma display panel device (PDP), a field emission display device (FED), an organic light emitting display device (OLED), and the like.

Particularly, OLED devices are a type of self-luminous display device without a separate light source, unlike LCDs. Thus, OLED devices can be manufactured into a lightweight and thin form wherein the display is driven with a low voltage. Also, OLED devices have preferable color expression ability, response speed, viewing angle, and contrast ratio (CR) compared to other known devices. Therefore, OLED devices have been developed as a next-generation display device with large area and high resolution.

As a display device has been miniaturized, efforts have been made to reduce a bezel area in order to increase the size of an effective display area in the same area of the OLED- OLED display devices are generally equipped with a display panel including an active area where images are displayed and a non-active area (e.g. a bezel area) defined along the circumference of the active area. A plurality of driving circuits are disposed in the non-active area and a printed circuit board (PCB) supplies control signals to the plurality of driving circuits. As the size of display devices, including OLED devices, has been reduced, efforts have been made to reduce the non-active area in order to increase the effective display area in the same size of OLED display. However, known OLED devices include the driving circuits or a plurality of link lines for electrically connecting the display panel and the driving circuits in the non-active area, which creates limitations in minimizing the bezel area.

Meanwhile, multi-panel display devices have been implemented recently to provide for display devices with larger screens. Multi-panel display devices typically include a plurality of display panels connected to each other to increase the display area. For example, a super-large screen can be implemented by tiling a plurality of organic light emitting display panels. However, when a plurality of display panels are connected to each other, a bezel area between adjacent display panels can be seen by a user.

BRIEF SUMMARY

An object to be achieved by the present disclosure is to reduce the size of a bezel of an OLED device by reducing the size of a non-active area.

Another object to be achieved by the present disclosure is to provide a multi-panel OLED device which has a non-active area with a reduced size, such that a bezel area between display panels is not visible by a user.

Yet another object to be achieved by the present disclosure is to provide a multi-panel display device in which a distance between outermost pixels of adjacent display panels is the same as the distance between pixels in a display panel.

Objects of the present disclosure are not limited to the above-mentioned objects, and other objects, which are not mentioned above, can be clearly understood by those skilled in the art from the following descriptions.

According to an aspect of the present disclosure, a multi-panel organic light emitting display device includes a plurality of display panels disposed to be adjacent to each other. Each of the plurality of display panels includes: a base substrate including an active area and a non-active area surrounding the active area; and a display unit including an organic light emitting element disposed on a top surface of the base substrate. Each of the plurality of display panels also includes: a plurality of signal lines disposed on the top surface of the base substrate and electrically connected to the display unit; and a plurality of link lines disposed under the base substrate. Each of the plurality of display panels further includes a plurality of side lines disposed on a side surface of the base substrate and connecting the plurality of signal lines and the plurality of link lines. Each of the plurality of display panels also includes a driving circuit disposed under the base substrate and electrically connected to the plurality of link lines.

According to another aspect of the present disclosure, a multi-panel organic light emitting display device includes a plurality of display panels disposed to be adjacent to each other. Each of the plurality of display panels includes: a base substrate including an active area and a non-active area surrounding the active area; and a display unit including an organic light emitting element disposed on a top surface of the base substrate. Each of the plurality of display panels also includes: an encapsulation substrate disposed on the display unit to be opposite to the base substrate; and a plurality of signal lines disposed on the top surface of the base substrate and electrically connected to the display unit. Each of the plurality of display panels further includes: a plurality of link lines disposed on a top surface of the encapsulation substrate and connected to a driving circuit; and a plurality of side lines disposed on a side surface of the base substrate and connecting the plurality of signal lines and the plurality of link lines.

Other detailed matters of the embodiments of the present disclosure are included in the detailed description and the drawings.

According to the present disclosure, a bezel area of a multi-panel organic light emitting display device can be reduced.

According to the present disclosure, in a multi-panel organic light emitting display device, the distance between outermost pixels of adjacent display panels is reduced to the distance between pixels in a display panel. Because pixels are not visible to a user, a bezel area between the display panels is similarly not visible to a user.

According to the present disclosure, it is possible to provide a large display device with excellent resolution.

According to the present disclosure, a large organic light emitting display device can be implemented by increasing the intensity of a signal transferred from a printed circuit board to an organic light emitting element.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
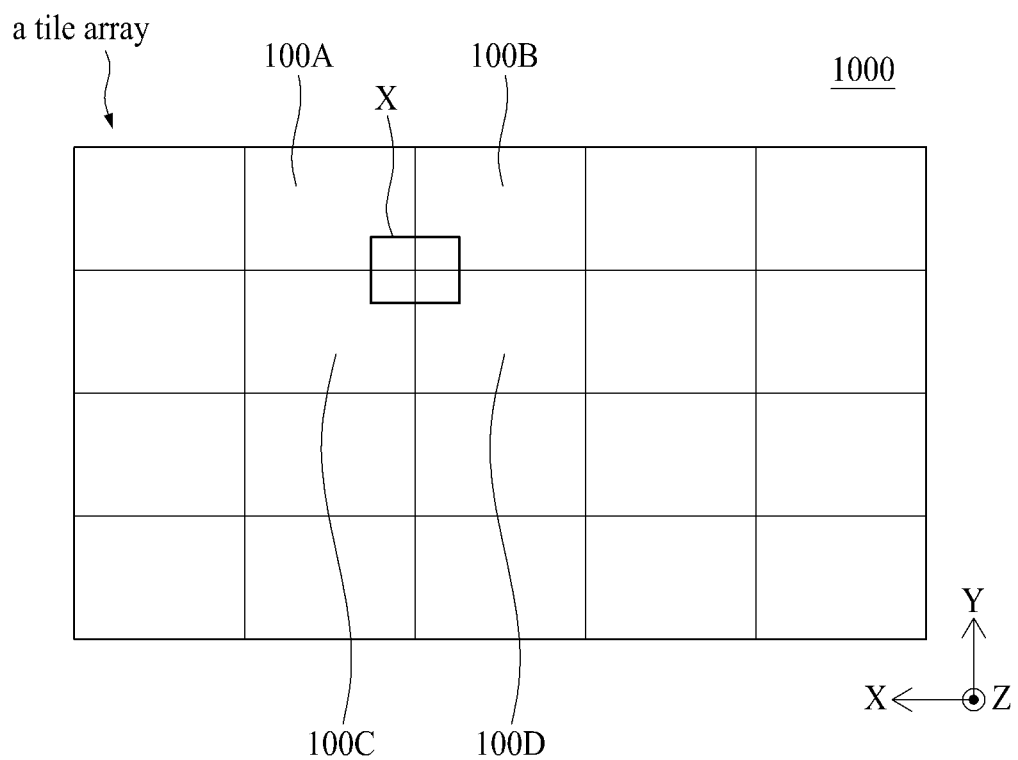
FIG. 1A through FIG. 1F are schematic diagrams provided to explain a multi-panel organic light emitting display device according to an embodiment of the present disclosure.

The advantages and characteristics of the present disclosure and a method of achieving the advantages and characteristics will be clear by referring to the embodiments described below in detail together with the accompanying drawings. However, the present disclosure is not limited to the embodiments disclosed herein but will be implemented in various forms. The embodiments are provided by way of example only so that a person with ordinary skill in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 1B:
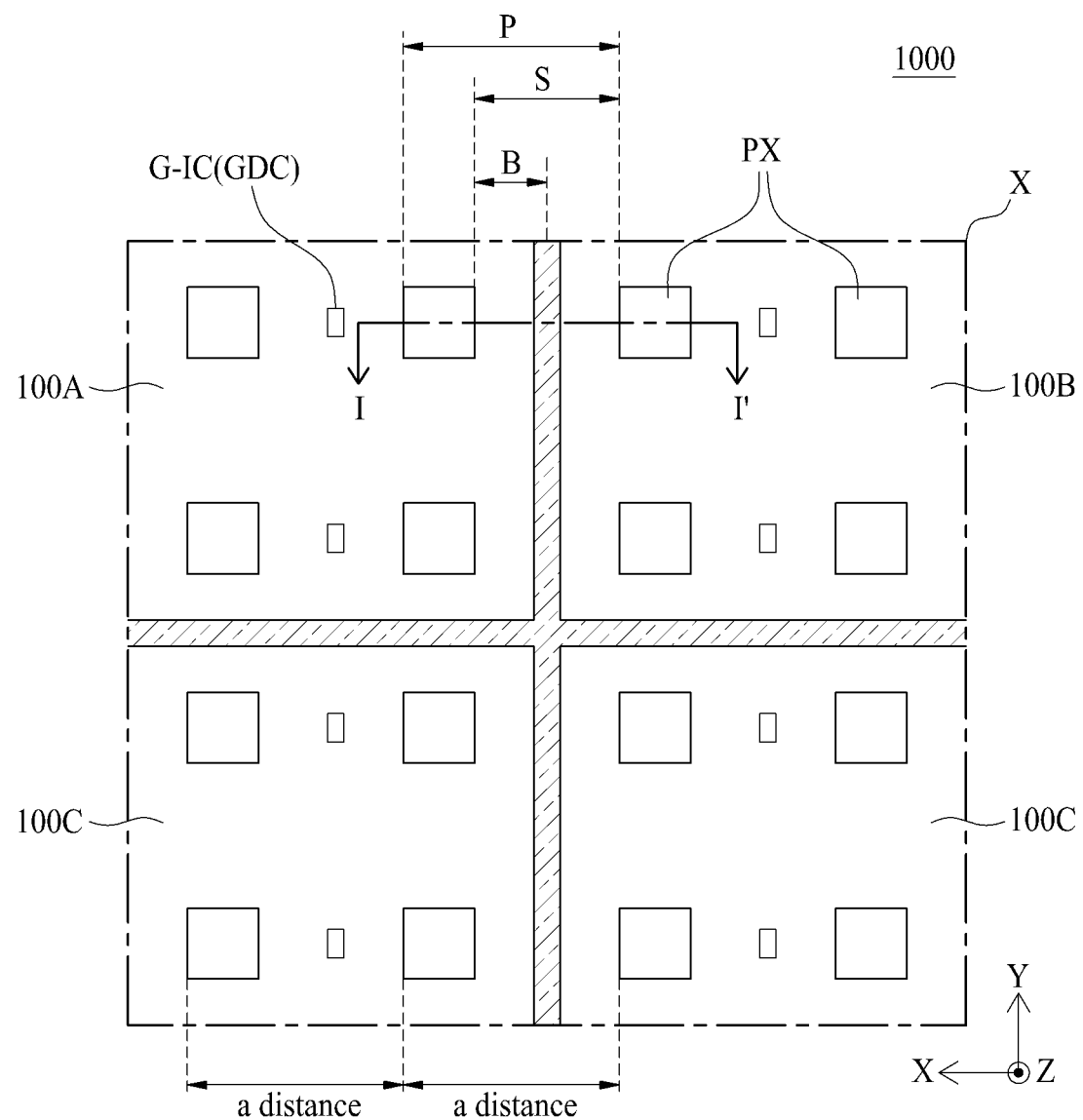
Figure 1C:
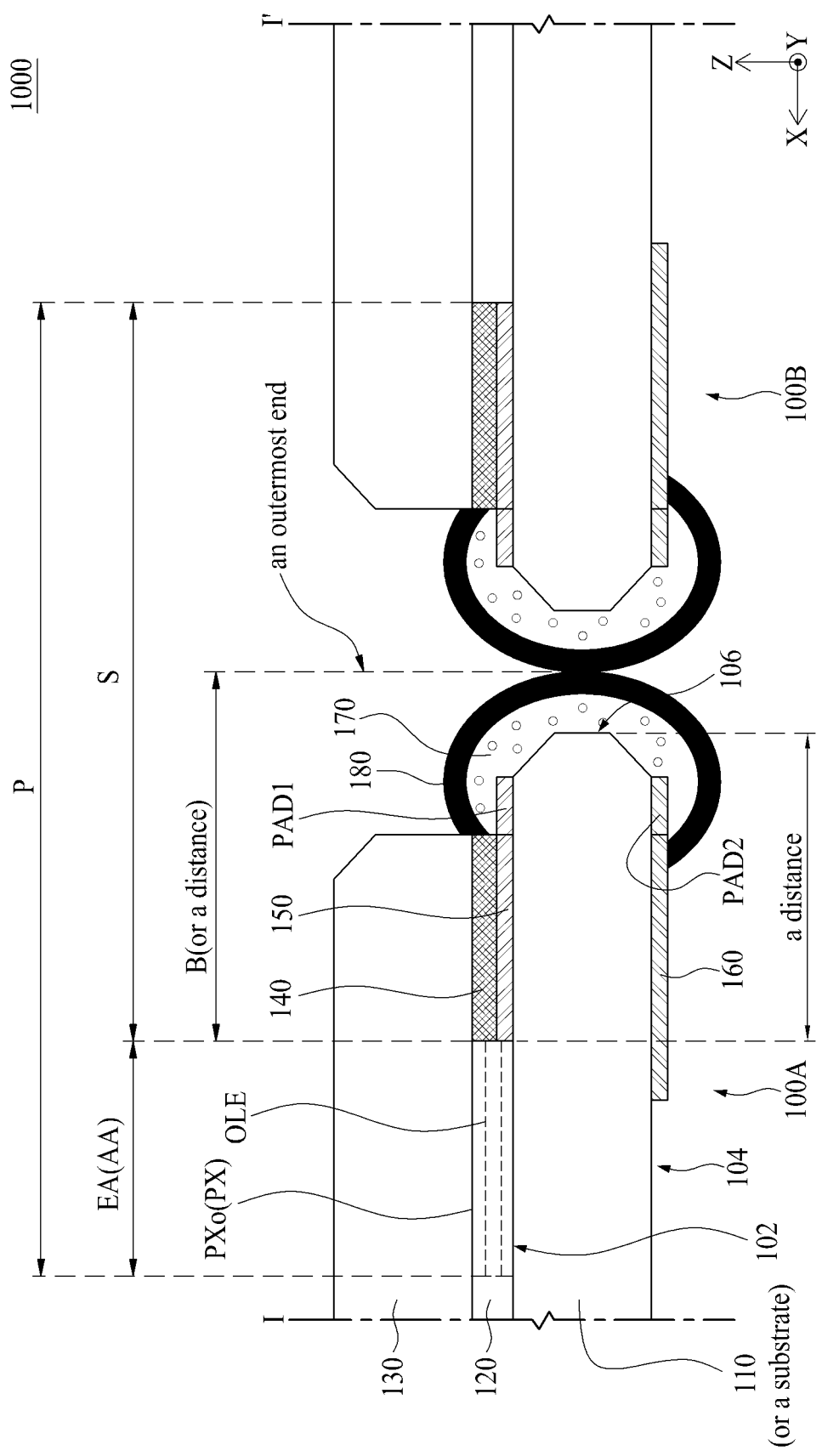
Figure 1D:
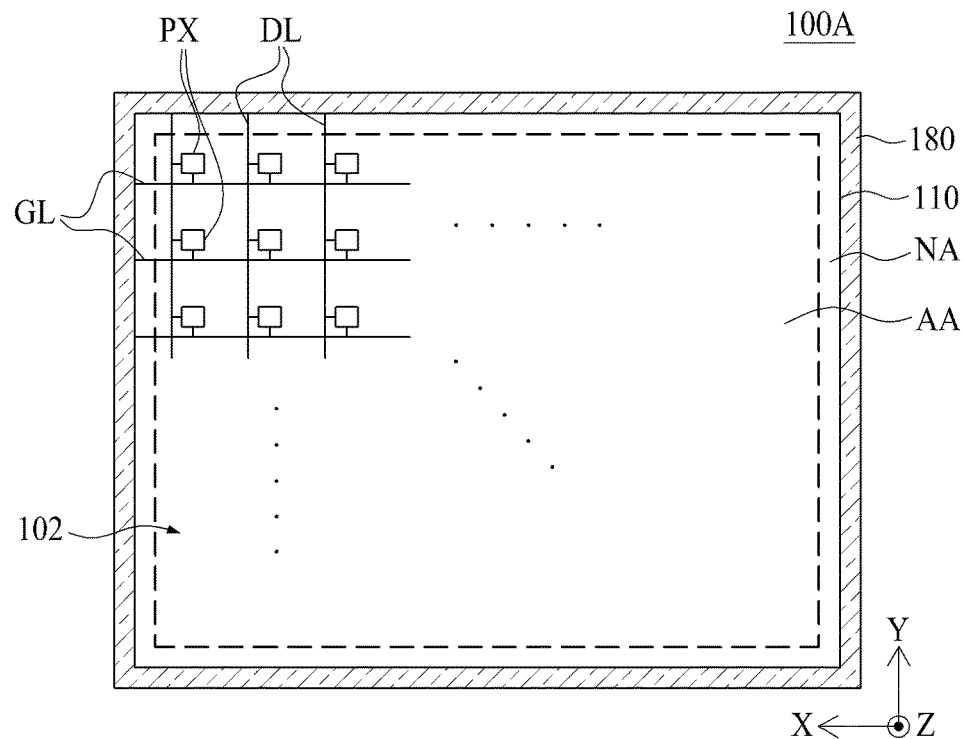
Figure 1E:
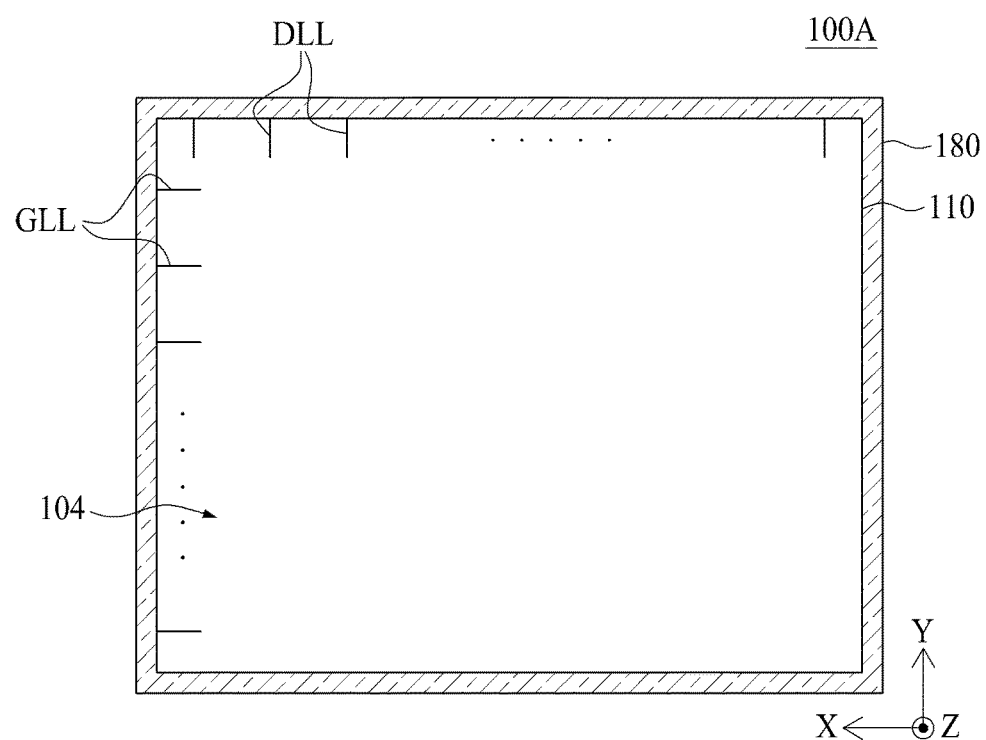
Figure 1F:
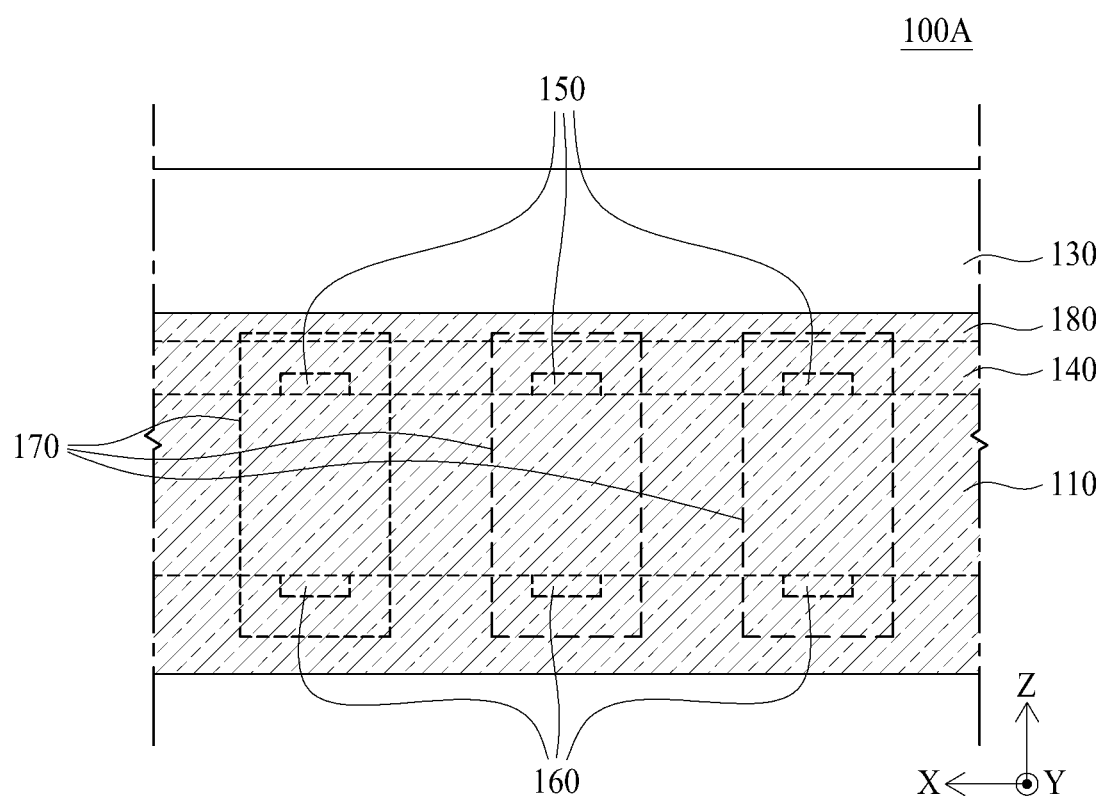

FIG. 1A through FIG. 1F are schematic diagrams provided to explain a multi-panel organic light emitting display device according to an embodiment of the present disclosure. Specifically, FIG. 1A is a schematic plan view provided to explain a multi-panel organic light emitting display device according to an embodiment of the present disclosure. FIG. 1B is a schematic enlarged plan view of an area X of FIG. 1A. FIG. 1C is a schematic cross-sectional view as taken along a line I-I' of FIG. 1B. FIG. 1D is a schematic top view of a first substrate of a first display panel in the multi-panel organic light emitting display device illustrated in FIG. 1A. FIG. 1E is a schematic rear view of the first substrate of the first display panel in the multi-panel organic light emitting display device illustrated in FIG. 1A. FIG. 1F is a schematic side view of the first display panel in the multi-panel organic light emitting display device illustrated in FIG. 1A.

Referring to FIG. 1A through FIG. 1F, a multi-panel organic light emitting display device 1000 according to an embodiment of the present disclosure includes a plurality of display panels coupled to each other. The plurality of display panels may be disposed in the form of an m×n tile array to implement the multi-panel organic light emitting display device 1000. FIG. 1A illustrates that 20 display panels are disposed in the form of a 5×4 tile array, for convenience of description. In one embodiment, each of the panels are adjacent to each other, as described below with reference to FIG. 1B. However, the present disclosure is not limited thereto. The number of display panels and their arrangement relative to one another can be selected.

Referring to FIG. 1B illustrating the area X of FIG. 1A, a plurality of display panels 100A, 100B, 100D, and 100D may be disposed in contact with each other and adjacent each other vertically or horizontally. For example, the plurality of display panels includes a first display panel 100A, a second display panel 100B, a third display panel 100C, and a fourth display panel 100D. The first display panel 100A and the second display panel 100B are disposed to be in contact with each other horizontally, and the first display panel 100A and the third display panel 100C are disposed to be in contact with each other vertically.

FIG. 1C illustrates a cross-sectional view of a contact portion between the first display panel 100A and the second display panel 100B. Referring to FIG. 1C, the first display panel 100A is equipped with a first substrate 110, a display unit 120, a second substrate 130, and a sealant 140. Further, the first display panel 100A is equipped with a plurality of signal lines 150, a plurality of link lines 160, a plurality of side lines 170, and an insulating layer 180. Herein, the other display panels, such as display panels 100B, 100C, 100D, as well as the remaining panels shown in FIG. 1A, may be configured identical to the first display panel 100A, or may be configured differently.

The first substrate 110 serves as a base substrate for supporting various components of the display panel 100A and may be an insulating substrate. For example, the first substrate 110 may be formed of glass or plastic. In some embodiments, the first substrate 110 may be formed of a material having flexibility so that the first substrate 110 can be bent as necessary. In one embodiment, the first substrate 110 includes a top surface 102 (e.g. in the orientation shown in FIG. 1C) opposite a rear surface 104, wherein the top surface 102 may also be referred to as a first surface and the rear surface may also be referred to as a second surface.

In the first substrate 110, an active area AA and a non-active area NA surrounding the active area AA may be defined. In FIG. 1D, a boundary between the active area AA and the non-active area NA is indicated with dashed lines. The active area AA is a region where images are actually displayed in the display panel 100A. The display unit 120 to be described later may be disposed in the active area AA. The non-active area NA is a region where images are not displayed and may be defined as a region surrounding the active area AA. Various lines such as gate lines GL and data lines DL connected to a thin film transistor (TFT) of the display unit 120 in the active area AA may be disposed in the non-active area NA. Further, a driving circuit, e.g., a data driving integrated circuit (IC) chip or a gate driving IC chip, and a plurality of pads may be disposed in the non-active area NA. However, the present disclosure is not limited thereto.

A plurality of pixels PX is defined in the active area AA of the first substrate 110. Each of the plurality of pixels PX is an individual unit that emits light. The plurality of pixels PX may include a red pixel, a green pixel, and a blue pixel, but is not limited thereto. The display unit 120 is disposed on each of the plurality of pixels PX.

The display unit 120 displays an image. In one embodiment, an organic light emitting element and a circuit unit for driving the organic light emitting element are included in the display unit 120. Specifically, the organic light emitting element includes an anode, a plurality of organic light emitting layers OLE, and a cathode to emit light by combining electrons and holes. The plurality of organic light emitting layers OLE may include a hole injection layer (HIL), a hole transport layer (HTL), an emitting layer (EML), an electron transport layer (ETL), and an electron injection layer (EIL), but is not limited thereto. Further, the circuit unit may include a plurality of TFTs, a capacitor, and a plurality of lines to drive the organic light emitting element.

Meanwhile, in the multi-panel organic light emitting display device 1000 shown in FIG. 1A through FIG. 1F, the display panel 100A may be of top emission type in which light from the organic light emitting element is emitted toward a top side of the first substrate 110 in the orientation shown in FIG. 1C, for example. In the top emission display panel, the circuit unit may be disposed on the first substrate 110 and the organic light emitting element may be disposed on the circuit unit. More specifically, the TFT may be disposed on the first substrate 110, a planarization layer may be disposed on the TFT, and the anode, the plurality of organic layers including the EML and the cathode may be laminated in sequence on the planarization layer.

Since the display panel 100A is of top emission type, the anode includes a reflective layer and a transparent conductive layer. The reflective layer may be formed of a material having excellent reflexibility, e.g., silver (Ag) or an Ag-containing alloy. The transparent conductive layer may be formed of a transparent conductive material, e.g., indium tin oxide (ITO)-, indium zinc oxide (IZO)-, indium tin zinc oxide (ITZO)-, zinc oxide (ZnO)-, and tin oxide (TiO)-based transparent conductive oxides (TCO). Like the transparent conductive layer, the cathode may be formed of a TCO.

FIG. 1C further shows the second substrate 130 disposed on the display unit 120, opposite to the first substrate 110. Specifically, the display unit 120 is on the first or top surface 102 of the first substrate 110 and the second substrate 130 is on the display unit. In one embodiment, the second substrate 130 is on a top surface of the display unit 120. The second substrate 130 serves as an encapsulation plate and protects the organic light emitting element of the display unit 120 against moisture, air, or physical impacts, which may permeate from the outside. The second substrate 130 may comprise one or more of, for example, glass, metal foil, and plastic film. Herein, the encapsulation plate is also referred to as an encapsulation substrate. In one embodiment, the second substrate 130 may not have a glass or plate form but may be an encapsulation layer formed by coating an organic material or an inorganic material. Herein, the encapsulation layer may be formed of various inorganic materials such as silicon nitride (SiNx), silicon oxide (SiOx), silicon oxide nitride (SiON), and the like. Otherwise, the encapsulation layer may be formed of organic materials such as polystyrene resin, acryl resin, epoxy resin, urea resin, isocyanate resin, xylene resin, and the like.

The sealant 140 is disposed between the first substrate 110 and the second substrate 130 in the non-active area NA. The sealant 140 is disposed to surround the periphery of the display unit 120 and bonds the first substrate 110 to the second substrate 130. The sealant 140 serves to suppress permeation of moisture and oxygen through a side surface of the display panel 100A and thus may be referred to as a dam. In one embodiment, the sealant may not be provided if the second substrate 130 does not have a glass or plate form but is an encapsulation layer formed by coating an organic material or an inorganic material.

Referring to FIG. 1C, the plurality of signal lines 150 are disposed on a top surface 102 of the first substrate 110 and the plurality of link lines 160 are disposed on a rear surface 104 of the first substrate 110. The plurality of signal lines 150 are electrically connected to components of the display unit 120 to transfer signals to the display unit 120. The plurality of link lines 160 serve to connect the plurality of signal lines 150 disposed on the first surface 102 of the first substrate 110 to the driving circuit.

Specifically, referring to FIG. 1D, which illustrates the top surface 102 of the first substrate 110, the plurality of signal lines 150 are disposed on the top surface 102 of the first substrate 110 and may include a plurality of gate lines GL and a plurality of data lines DL. The plurality of gate lines GL and the plurality of data lines DL are connected to the TFT of the display unit 120 disposed in the active area AA to transfer gate signals and data signals, respectively.

Referring to FIG. 1E, which illustrates the rear surface 104 of the first substrate 110, the plurality of link lines 160 are disposed on the rear surface 104 of the first substrate 110 and may include a plurality of gate link lines GLL and a plurality of data link lines DLL. The plurality of gate link lines GLL serve to connect the plurality of gate lines GL disposed on the top surface 102 of the first substrate 110 to a gate driving circuit. Also, the plurality of data link lines DLL serve to connect the plurality of data lines DL disposed on the top surface 102 of the first substrate 110 to a data driving circuit. The plurality of gate link lines GLL and the plurality of data link lines DLL may be extended from an end or outermost edge of the rear surface 104 of the first substrate 110 toward a center of the rear surface 104 of the first substrate 110.

Referring to FIG. 1C, each of the plurality of signal lines 150 may include a first pad PAD1, and each of the plurality of link lines 160 may include a second pad PAD2. The first pad PAD1 is a region in contact with the side line 170 to be described later. Herein, the first pad PAD1 may be a metal layer extended from the plurality of signal lines 150, and the second pad PAD2 may be a metal layer extended from the plurality of link lines 160.

In one embodiment, one of the gate driving circuit electrically connected to the plurality of gate link lines GLL or the data driving circuit electrically connected to the plurality of data link lines DLL may be disposed on the rear surface 104 of the first substrate 110. Otherwise, both the gate driving circuit and the data driving circuit may be disposed on the rear surface 104 of the first substrate 110. Herein, the gate driving circuit and the data driving circuit may be mounted directly on the rear surface of the first substrate 110 by a chip on glass (COG) method. Otherwise, the gate driving circuit and the data driving circuit may be disposed on the rear surface 104 of the first substrate 110 by a chip on film (COF) method. Meanwhile, the driving circuit may be connected to a printed circuit board (PCB). The PCB may transfer various signals to the plurality of signal lines 150 and the display unit 120 disposed on the first substrate 110. The layout of the gate driving circuit and the data driving circuit will be described in more detail with reference to FIG. 4A through FIG. 6B.

Referring to FIG. 1C, the plurality of side lines 170 are disposed on a side surface 106 of the first substrate 110. The plurality of side lines 170 serve to electrically connect the plurality of signal lines 150 disposed on the top surface 102 of the first substrate 110 to the plurality of link lines 160 disposed on the rear surface 104 of the first substrate 110. The plurality of side lines 170 are disposed to cover ends of the plurality of signal lines 150 disposed on the top surface 102 of the first substrate 110, the side surface 106 of the first substrate 110, and ends of the plurality of link lines 160 disposed on the rear surface 104 of the first substrate 110. That is, the plurality of side lines 170 are disposed to continuously cover the first pads PAD1 of the plurality of signal lines 150, the side surface 106 of the first substrate 110, and the second pads PAD2 of the plurality of link lines 160.

More specifically, the plurality of side lines 170 may include a first side line that connects the gate line GL on the top surface 102 of the first substrate 110 to the gate link line GLL on the rear surface 104 of the first substrate 110. Further, the plurality of side lines 170 may include a second side line that connects the data line DL on the top surface 102 of the first substrate 110 to the data link line DLL on the rear surface 104 of the first substrate 110.

In one embodiment, the plurality of side lines 170 include a patterned metal layer to connect the corresponding signal lines 150 and link lines 160, respectively. The patterned metal layer may be formed of a conductive material such as Silver (Ag), or the like.

Specifically, the plurality of side lines 170 may be formed by laser transfer printing. For example, the plurality of side lines 170 may be formed by irradiating a laser onto a base member on which a metal transfer layer is formed to transfer the metal transfer layer onto the side surface of the first substrate 110. Herein, the metal transfer layer may be formed of a conductive material such as Ag, or the like.

Herein, the side line 170 may have a greater or smaller width than the signal line 150 and the link line 160. Preferably, the side line 170 has a greater width than the signal line 150 and the link line 160 to increase a contact area between the lines.

The insulating layer 180 is formed to cover the plurality of side lines 170. The insulating layer 180 is preferably a black colored material so as to cover the side lines 170, and, thus, hide the side lines 170. In one embodiment, the side lines 170 are not visible by a user facing the third surface 106 of the first substrate 110. If the plurality of side lines 170 are formed of a metal material, external light may be reflected from the plurality of side lines 170, or light emitted from the display unit 120 may be reflected from the plurality of side lines 170. Thus, the side lines 170 can be seen by a user. Accordingly, the insulating layer 180 formed of the black colored material is disposed to cover the plurality of side lines 170 to overcome the same.

Referring to FIG. 1D and FIG. 1E, the insulating layer 180 is disposed on the top surface 102 of the first substrate 110 so as to cover at least a part of the non-active area NA. The insulating layer 180 is disposed continuously along an edge of the first substrate 110 so as to surround the top surface 102 and the side surface 106 of the first substrate 110. Likewise, the insulating layer 180 is disposed continuously along the edge of the first substrate 110 so as to surround the entire side surface 106 of the first substrate 110. That is, the insulating layer 180 may be formed of a single layer that covers all of the plurality of side lines 170. In one embodiment, the insulating layer 180 comprises a resin, a polymer, a thermoplastic, or the like.

Herein, the insulating layer 180 may be disposed to cover a part of the plurality of signal lines 150, i.e., the gate lines GL and the data lines DL, disposed on the top surface 102 of the first substrate 110. The insulating layer 180 may also be disposed to cover a part of the plurality of link lines 160, i.e., the gate link lines GLL and the data link lines DLL, disposed on the rear surface 104 of the first substrate 110. Further, the insulating layer 180 is disposed on the side surface of the first substrate 110 where the gate lines GL and the data lines DL are not disposed and thus can further suppress reflection of external light.

Referring to FIG. 1C, in the display panel 100A included in the multi-panel organic light emitting display device 1000 according to an embodiment of the present disclosure, various drivers such as the gate driving circuit or the data driving circuit are disposed on the rear surface 104 of the first substrate 110. Also, the PCB is disposed on the rear surface 104 of the first substrate 110. Thus, the non-active area NA can be reduced. As a result, with the above-described configuration, a bezel area of the display panel 100A can be reduced.

By reducing the bezel area of the display panel 100A, a bezel area of adjacent displays 100A, 100B in the multi-panel organic light emitting display device 1000 may be reduced so that the combined bezel area is small enough that it is not visible by the user.

In the multi-panel organic light emitting display device 1000, the distance between outermost pixels PXo of the adjacent display panels 100A and 100B is generally greater than the distance between pixels in the display panel 100A due to the size of the bezel area of the display panel 100A. Therefore, the distance between pixels in the display panel 100A is different from the distance between pixels in a contact portion between the display panels 100A and 100B. Thus, the bezel area between the display panels can be more clearly seen by the user, and when a super-large screen is implemented using the display panels, it looks unnatural and inharmonious. If the distance between pixels in the display panel 100A is increased to be the same as the distance between outermost pixels PXo of the adjacent display panels in order for the bezel area between the display panels not to be seen, the resolution of the display device may be degraded.

In the multi-panel organic light emitting display device 1000 according to an embodiment of the present disclosure, the bezel areas of the display panels 100A and 100B can be reduced. Thus, the distance between outermost pixels of the adjacent display panels 100A and 100B can be reduced to the distance between pixels in the display panel 100A. Therefore, it is possible to implement a large display device in which the bezel area between the display panels 100A is not seen (e.g., seamless) and which has high resolution.

More specifically, referring to FIG. 1B and FIG. 1C, in the multi-panel organic light emitting display device 1000 according to an embodiment of the present disclosure, a pitch P between pixels PX is the sum of a seam S between the outermost pixels PXo of the adjacent display panels 100A and 100B and a length of an emission area EA of the pixel PX. Herein, the seam S between the outermost pixels PXo of the adjacent display panels is double the size B of the bezel area of the display panel 100A. In one embodiment, the bezel area includes the non-active area NA of the first substrate 110, the side lines 170, and the insulating layer 180. The multi-panel organic light emitting display device 1000 according to an embodiment of the present disclosure can have a narrow bezel. Thus, the seam S between the outermost pixels PXo of the adjacent display panels 100A and 100B can be reduced. Therefore, the pitch P between the pixels can also be reduced, and excellent resolution can be achieved without seams between panels 100A, 100B.

Figure 2A:
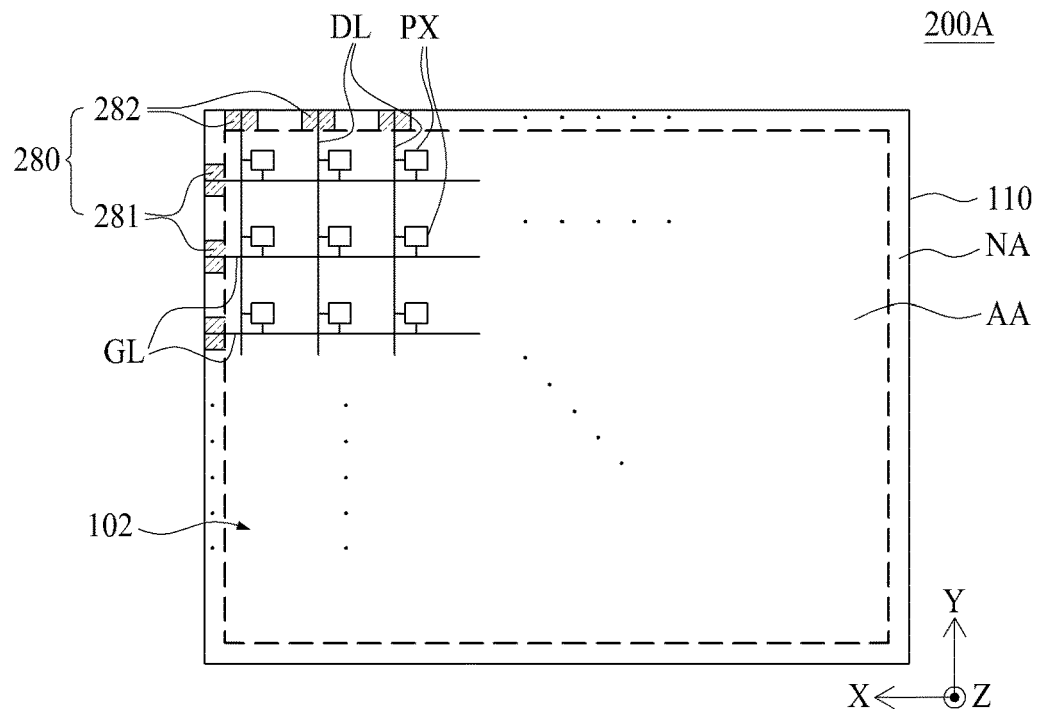
FIG. 2A and FIG. 2B are schematic diagrams provided to explain a multi-panel organic light emitting display device according to another embodiment of the present disclosure.
Figure 2B:
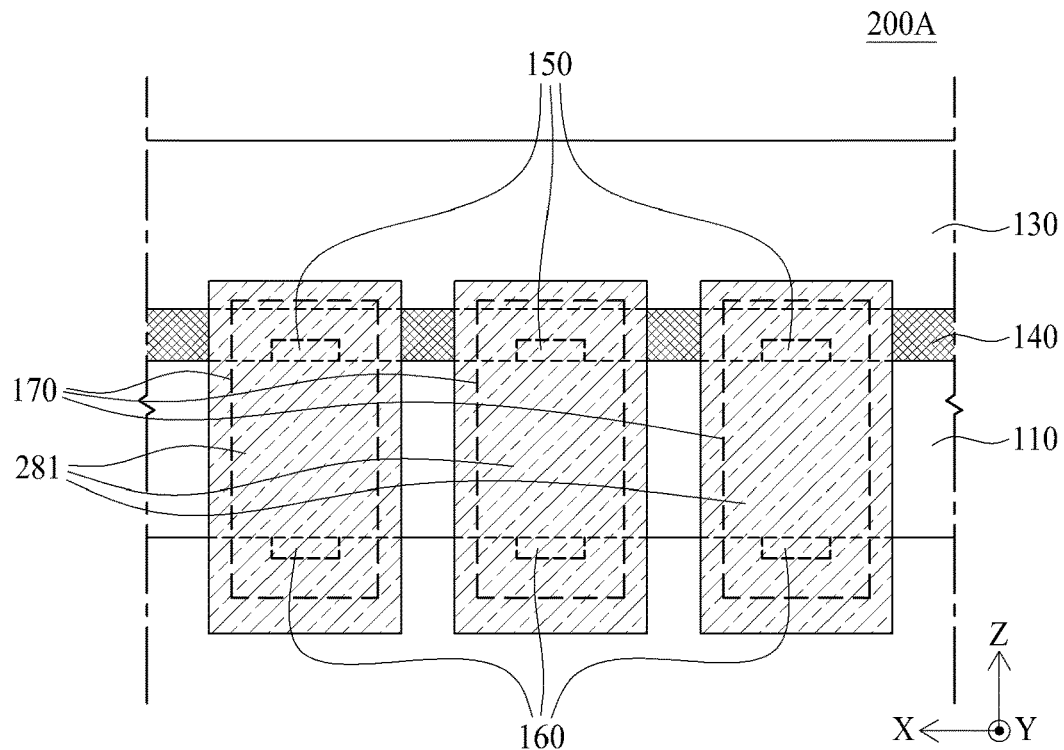

FIG. 2A and FIG. 2B are schematic diagrams provided to explain a multi-panel organic light emitting display device according to another embodiment of the present disclosure. FIG. 2A is a schematic top view of the first substrate 110 of a first display panel 200A in a multi-panel organic light emitting display device according to another embodiment of the present disclosure. FIG. 2B is a schematic side view of the first display panel 200A in the multi-panel organic light emitting display device according to another embodiment of the present disclosure. The multi-panel organic light emitting display device in FIG. 2A and FIG. 2B is similar to the multi-panel organic light emitting display device 1000 shown in FIG. 1A through FIG. 1F except for the differences described below, including with respect to the insulating layer 280. Therefore, redundant description will be omitted.

Referring to FIG. 2A, the insulating layer 280 may have a patterned structure to cover each of the plurality of side lines 170 that is patterned to connect the signal lines 150 to the link lines 160, respectively. As shown in FIG. 1E, the insulating layer 180 is formed as a single layer to cover all of the plurality of side lines 170 and disposed continuously along the edge of the first substrate 110. However, the insulating layer 280 shown in FIG. 2A and FIG. 2B has a plurality of patterned insulating structures corresponding to the respective side lines 170. Referring to FIG. 2B, the first substrate 110 and the sealant 140 are not covered in part by the insulating layer 280 and thus are exposed to the external environment. More specifically, the insulating layer 280 may include a plurality of first insulating patterns 281 covering the side lines 170 that connects the gate lines GL on the top surface 102 of the first substrate 110 and the gate link lines GLL on the rear surface 104 of the first substrate 110. Further, the insulating layer 280 may include a plurality of second insulating patterns 282 covering the side lines 170 that connects the data lines DL on the top surface 102 of the first substrate 110 and the data link lines DLL on the rear surface 104 of the first substrate 110.

As shown in FIG. 2A and FIG. 2B, if the insulating layer 280 has patterned structures according to the plurality of side lines 170, the insulating layer 280 and the side lines 170 may be formed continuously by laser transfer printing. Specifically, the side lines 170 may be patterned on the side surface of the first substrate 110 and then, the insulating layer 280 may be patterned on the side lines 170 disposed on the side surface of the first substrate 110.

Figure 3A:
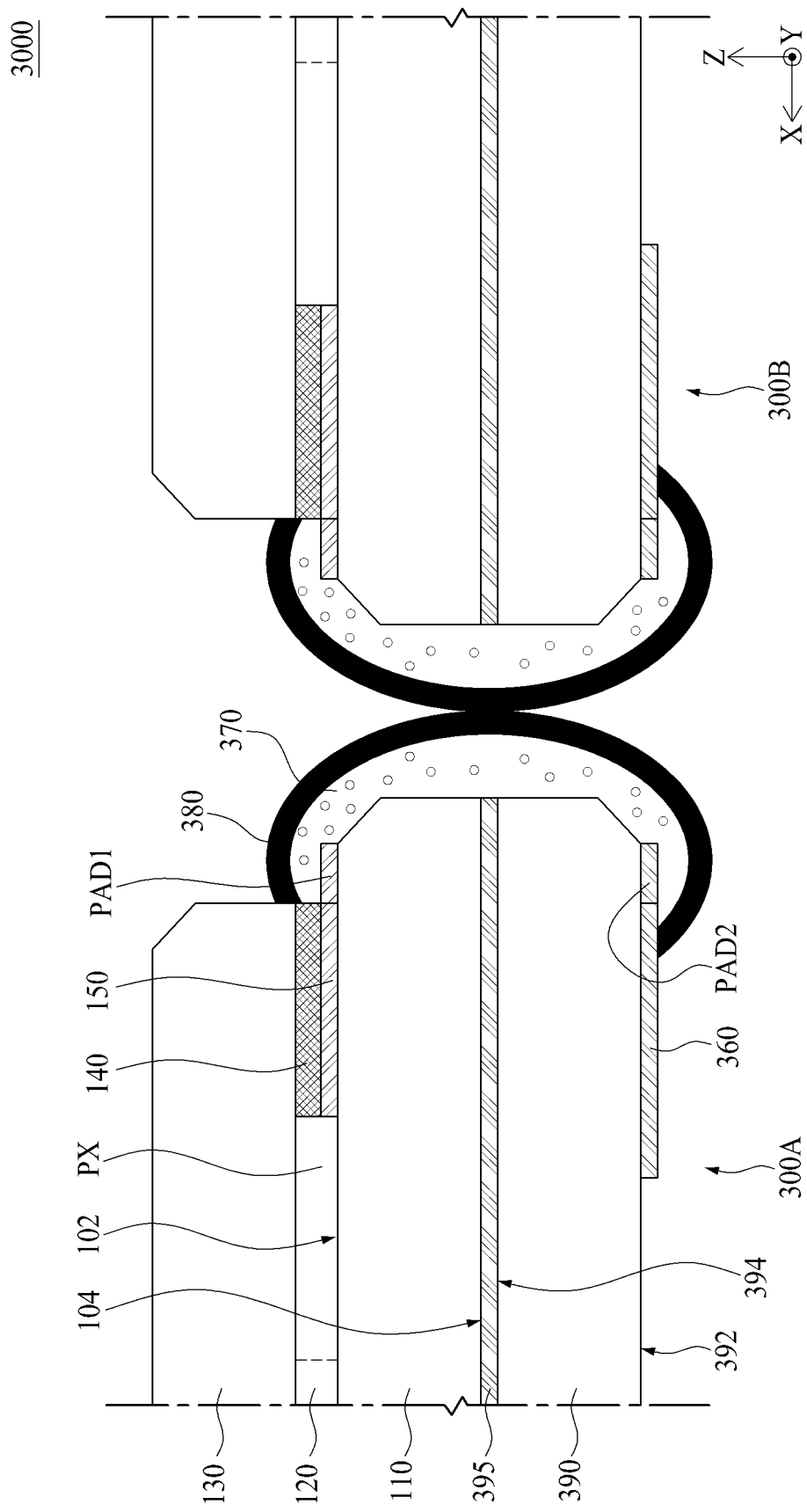
FIG. 3A through FIG. 3D are schematic diagrams provided to explain a multi-panel organic light emitting display device with a display panel according to yet another embodiment of the present disclosure.
Figure 3B:
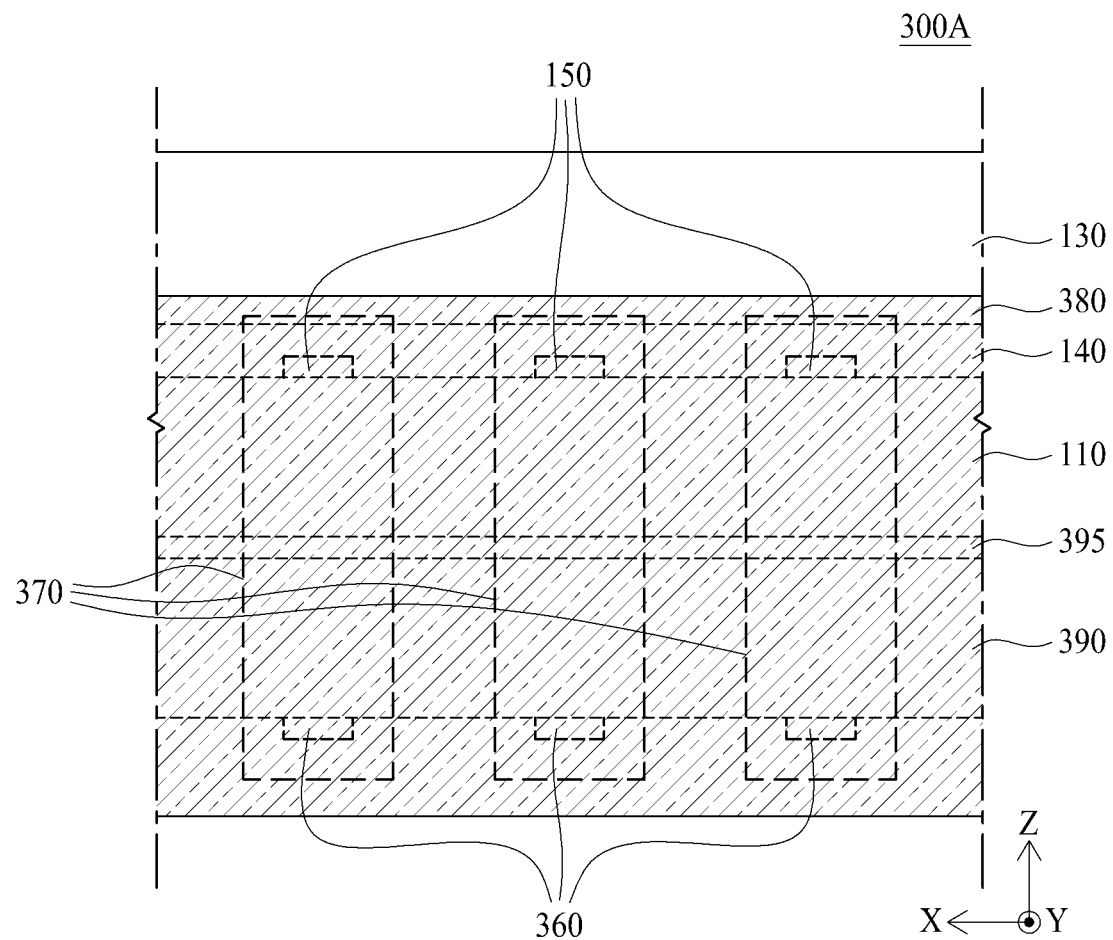
Figure 3C:
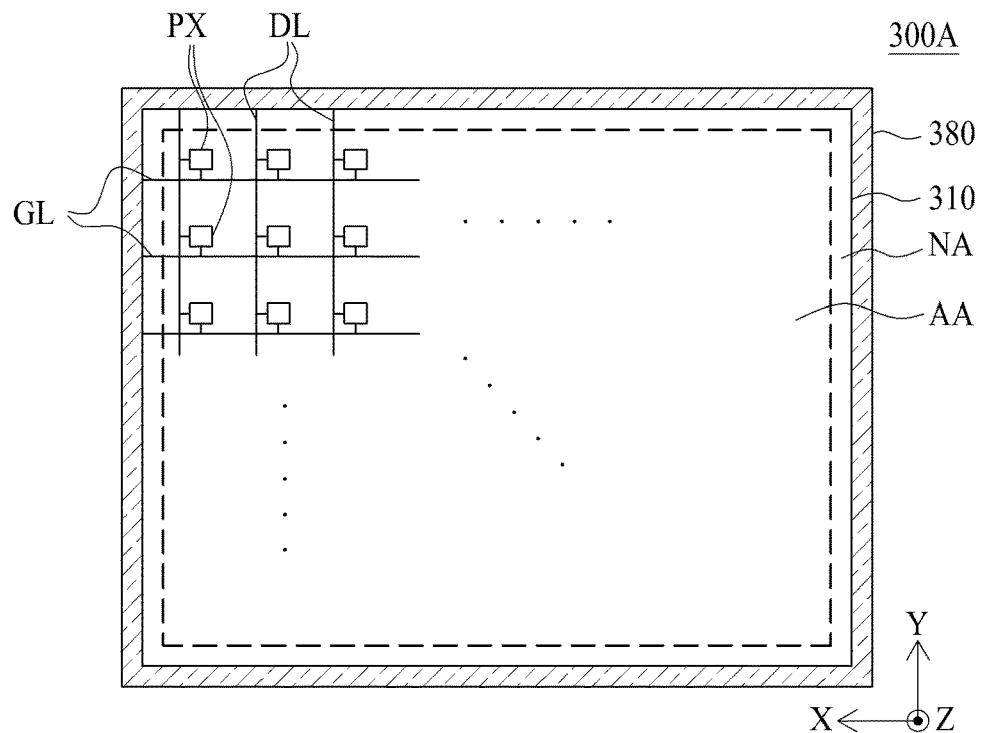
Figure 3D:
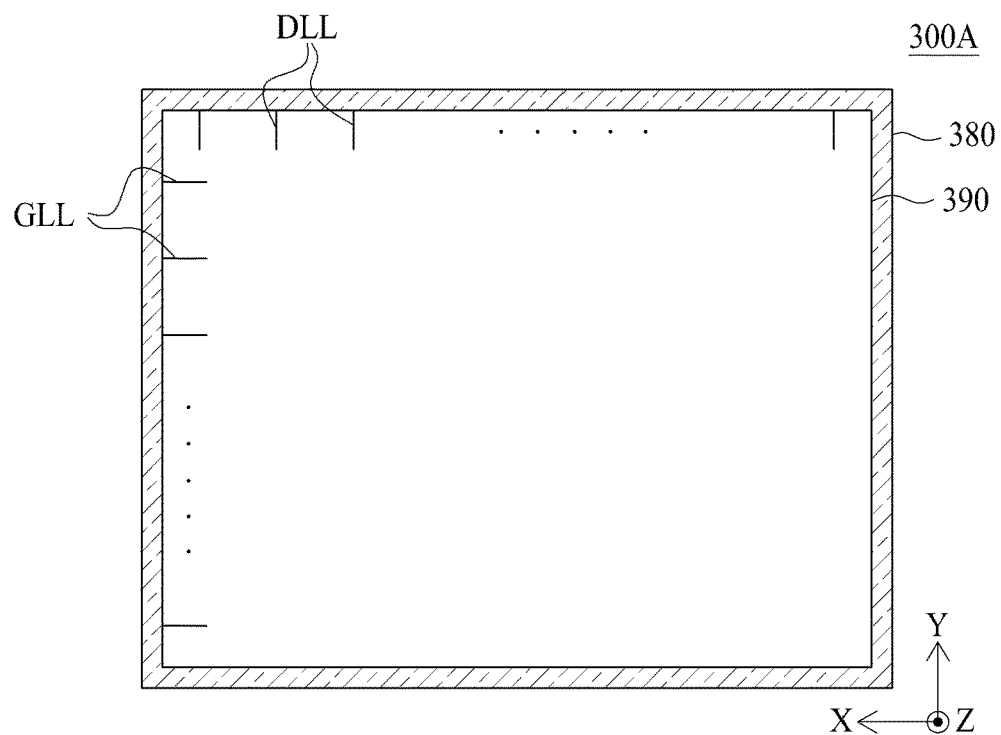

FIG. 3A through FIG. 3D are schematic diagrams provided to explain a multi-panel organic light emitting display device according to yet another embodiment of the present disclosure. Specifically, FIG. 3A is a schematic cross-sectional view of a contact portion between a first display panel 300A and a second display panel 300B included in a multi-panel organic light emitting display device 3000 according to yet another embodiment of the present disclosure. FIG. 3B is a schematic side view of the first display panel 300A of the multi-panel organic light emitting display device 3000 according to yet another embodiment of the present disclosure. FIG. 3C is a schematic top view of the first substrate 110 of the first display panel 300A shown in FIG. 3A. FIG. 3D is a schematic rear view of a third substrate 390 of the first display panel 300A shown in FIG. 3A. The multi-panel organic light emitting display device shown in FIG. 3A through FIG. 3D is similar to the multi-panel organic light emitting display device 1000 shown in FIG. 1A through FIG. 1F except for the differences described below, including that the third substrate 390 is further disposed on the rear surface 104 of the first substrate 110, and, thus, the plurality of link lines 360, the plurality of side lines 170, and the insulating layer 180 are configured differently. Therefore, redundant description will be omitted.

Referring to FIG. 3A, the third substrate 390 is disposed on the rear surface 104 of the first substrate 110. The third substrate 390 serves as an auxiliary substrate supporting components disposed on a lower side of the display device and may be an insulating substrate. For example, the third substrate 390 may be formed of glass or resin. Further, the third substrate 390 may contain a polymer or plastic. In one embodiment, the third substrate 390 is formed of the same material as the first substrate 110.

The plurality of link lines 360 are disposed on a rear surface 392 of the third substrate 390. In one embodiment, the rear surface 392 is a second surface opposite a first or top surface 394 of the third substrate 390. Specifically, the plurality of gate link lines GLL and the plurality of data link lines DLL may be disposed on the rear surface 392 of the third substrate 390.

An adhesive layer 395 is disposed between the first substrate 110 and the third substrate 390. The adhesive layer 395 bonds the first substrate 110 to the third substrate 390. The adhesive layer 395 may be formed of a material which can be cured by various curing methods to bond the first substrate 110 to the third substrate 390. The adhesive layer 395 may be disposed in whole or only in part between the first substrate 110 and the third substrate 390.

Herein, the size of the third substrate 390 may be equal to or smaller than that of the first substrate 110. The size of the third substrate 390 can be selected according to the kind and the structure of a driving circuit to be disposed on the rear surface 392 of the third substrate 390. The size of the third substrate 390 and the layout of a driving circuit will be described later with reference to FIG. 4A through FIG. 6B.

The multi-panel organic light emitting display device 3000 shown in FIG. 3A through FIG. 3D has a merit of easiness in manufacturing each display panel, such as panel 300A or 300B, for example. Specifically, like the multi-panel organic light emitting display device 1000 shown in FIG. 1A through FIG. 1F, the multi-panel organic light emitting display device 3000 may include the display panel 100A in which the display unit 120 and the plurality of signal lines 150 are disposed on the top surface 102 of the first substrate 110 and the link lines 360 and the driving circuit are disposed on the rear surface 104 of the first substrate 110. In this case, it is difficult to place the components on both surfaces 102, 104 of the first substrate 110. However, the display unit 120 and the signal lines 150 may be disposed on the first substrate 110 and the link lines 360 and the driving circuit may be disposed on the third substrate 390 and then the first substrate 110 and the third substrate 390 may be bonded to each other. This process is advantageous in terms of process stability and product reliability.

Hereafter, a structure of the driving circuit disposed on the rear surface 392 of the third substrate 390 will be described.

Figure 4A:
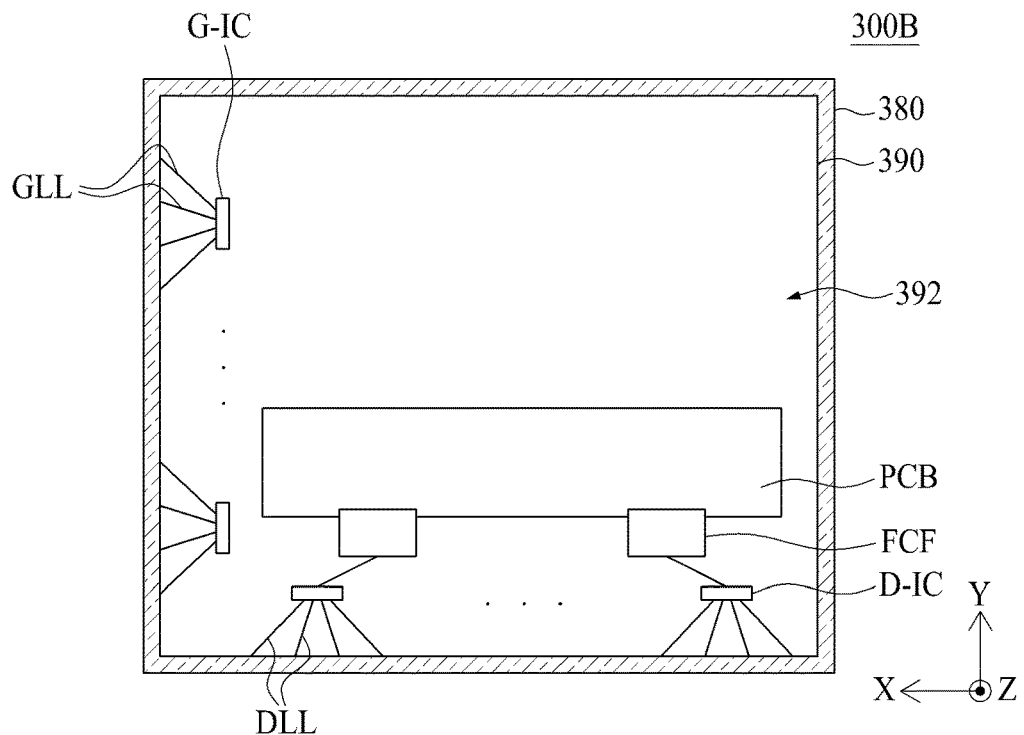
FIG. 4A and FIG. 4B are schematic rear views provided to explain a structure of a driving circuit disposed on a surface of a substrate of the display panel of FIG. 3A through FIG. 3D.
Figure 4B:
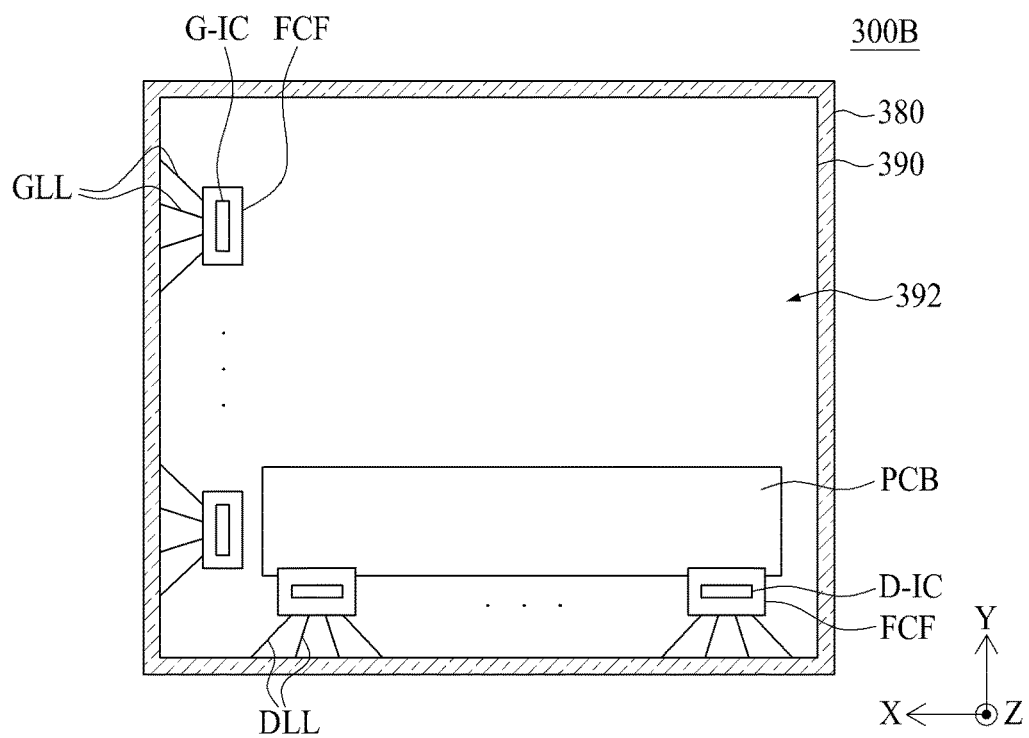

FIG. 4A and FIG. 4B are schematic rear views provided to explain a structure of a driving circuit disposed on the rear surface 392 of the third substrate 390 of the display panel 300A illustrated in FIG. 3A through FIG. 3D.

Beginning with FIG. 4A, a gate driving circuit (G-IC), a data driving circuit (D-IC), a flexible circuit film (FCF), and a printed circuit board (PCB) are disposed on the rear surface 392 of the third substrate 390.

In one embodiment, the G-IC and the D-IC are disposed on the rear surface 392 of the third substrate 390 by the COG method. More specifically, the G-IC is directly connected to the gate link lines GLL and the D-IC is directly connected to the data link lines DLL, which are mounted directly on the rear surface 392 of the third substrate 390.

The FCF is disposed on the rear surface 392 of the third substrate 390 and electrically connected to the D-IC. The FCF serves to transfer various signals from the PCB to the D-IC. A plurality of lines may be disposed on or within the FCF to electrically connect the PCB to the D-IC. One side of the FCF is connected to the rear surface 392 of the third substrate 390 and the other side of the FCF is connected to the PCB. The FCF is a flexible insulating film and may be formed as a heat-resistant plastic film of a flexible material such as polyester (PET) or polyimide (PI).

The PCB serves to transfer various signals to the display unit 120 through the plurality of link lines 160 disposed on the third substrate 390. For example, a timing controller or the like may be disposed on the PCB. The timing controller may supply various signals to the D-IC through the FCF. For example, the timing controller may generate a data driver control signal (DDC), a gate driver control signal (GDC), and the like and supply them to the D-IC.

Turning to FIG. 4B, the G-IC, the D-IC, the FCF, and the PCB are disposed on the rear surface 392 of the third substrate 390.

In this case, the G-IC and the D-IC are disposed on the rear surface 392 of the third substrate 390 by the COF method. Specifically, each of the G-IC and the D-IC is disposed on the FCF and the FCF is disposed directly on the rear surface 392 of the third substrate 390.

In the same manner as in FIG. 4A, the G-IC is connected to the gate link lines GLL through the plurality of lines disposed on the FCF and the D-IC is connected to the data link lines DLL through the plurality of lines disposed on the FCF.

Referring to FIG. 4A and FIG. 4B, both the G-IC and the D-IC are disposed on the rear surface 392 of the third substrate 390, and, thus, the third substrate 390 may be disposed to have the same size as the first substrate 110.

Figure 5A:
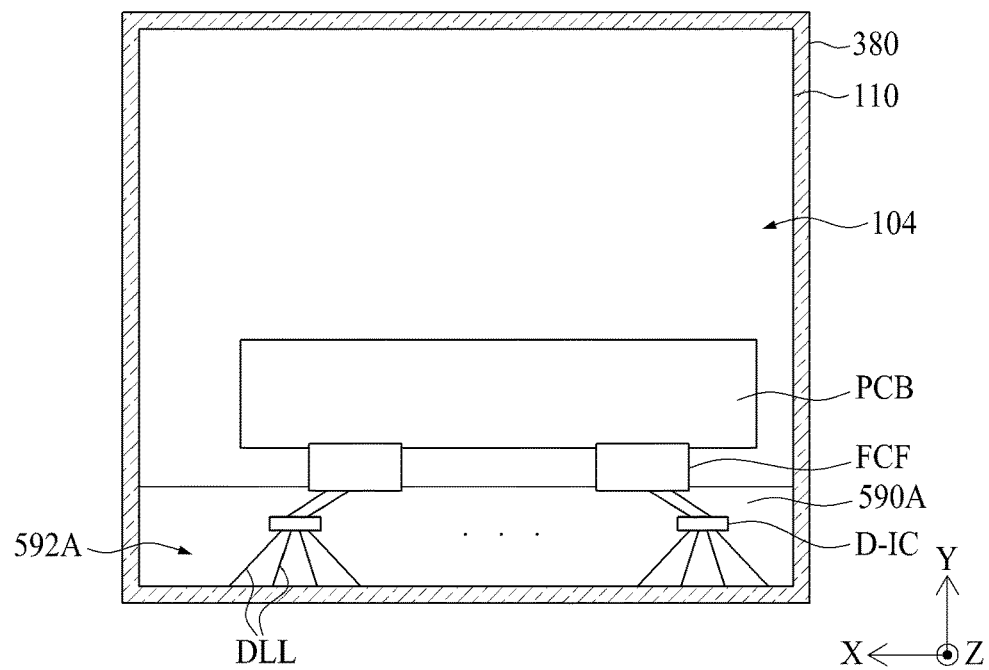
FIG. 5A and FIG. 5B are schematic rear views provided to explain another embodiment of a structure of the driving circuit disposed on a surface of a substrate of a display panel.
Figure 5B:
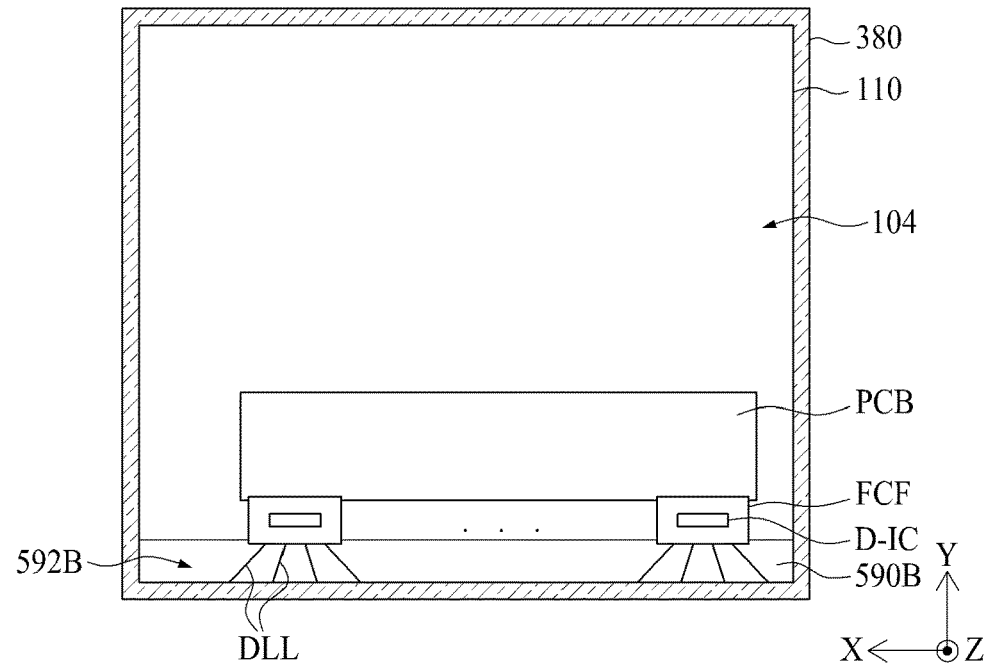

FIG. 5A and FIG. 5B are schematic rear views provided to explain another embodiment of a structure of a driving circuit on one or more substrates of a display panel. The display panels 500A, 500B shown in FIG. 5A and FIG. 5B is the same as the display panel 300A shown in FIG. 4A and FIG. 4B except the layout of the circuits and the size of a third substrate 590A, 590B, in addition to other differences described below. The third substrates 590A, 590B described with reference to FIG. 5A and FIG. 5B have a first or rear surface 592A, 592B, respectively. It is to be understood that the third substrates 590A, 590B may be similar to the third substrate 390 except for the differences described below. Therefore, redundant description will be omitted.

Referring first to FIG. 5A, the FCF and the PCB are disposed on the rear surface 104 of the first substrate 110. The D-IC is disposed on the rear surface 592A of the third substrate 590A by the COG method and electrically connected to the PCB through the FCF. In FIG. 5A, the data link lines DLL and the driving circuit D-IC are disposed directly on the rear surface 592A of the third substrate 590A.

In the embodiment shown in FIG. 5A, the G-IC is disposed on the top surface 102 of the first substrate 110. For example, the G-IC may be implemented using TFTs disposed in the non-active area NA of the first substrate 110. This gate driving circuit may also be referred to as a gate-in-panel (GIP). Otherwise, the G-IC may be disposed between a plurality of pixels in the active area AA of the first substrate 110. This gate driving circuit GDC may also be referred to as a gate-in-active area (GIA).

Turning to FIG. 5B, the D-IC, the FCF, and the PCB are disposed on the rear surface 104 of the first substrate 110. Specifically, the D-IC is disposed on the FCF by the COF method, wherein the FCF is disposed on the rear surface 104 of the first substrate 110 to be electrically connected to the PCB.

As in FIG. 5A, the G-IC in FIG. 5B is disposed on the top surface 102 of the first substrate 110. In FIG. 5B, only the data link lines DLL are disposed on the rear surface 592B of the third substrate 590B.

In one embodiment, such as in FIG. 5A, the D-IC and the data link lines DLL are disposed only on the rear surface 592A of the third substrate 590A and the G-IC is disposed on the first substrate 110. Thus, the third substrate 590A in FIG. 5A can be selected to have a size and a shape for accommodating the D-IC and the data link lines DLL. Because the D-IC and the data link lines DLL typically occupy less space than the other components, such as the PCB, the third substrate 590A has a smaller size than the first substrate 110 and the third substrate 390, compared to the embodiment shown in FIG. 4A and FIG. 4B, where the first and third substrates 110, 390 have the same size. In one embodiment, such as in FIG. 5B, only the data link lines DLL are on the rear surface 592B of the third substrate 590B. As such, the size and shape of the third substrate 590B can be selected to be smaller than the third substrate 590A described with reference to FIG. 5A and the first and third substrates 110, 390 described with reference to FIG. 4A and FIG. 4B.

Figure 6A:
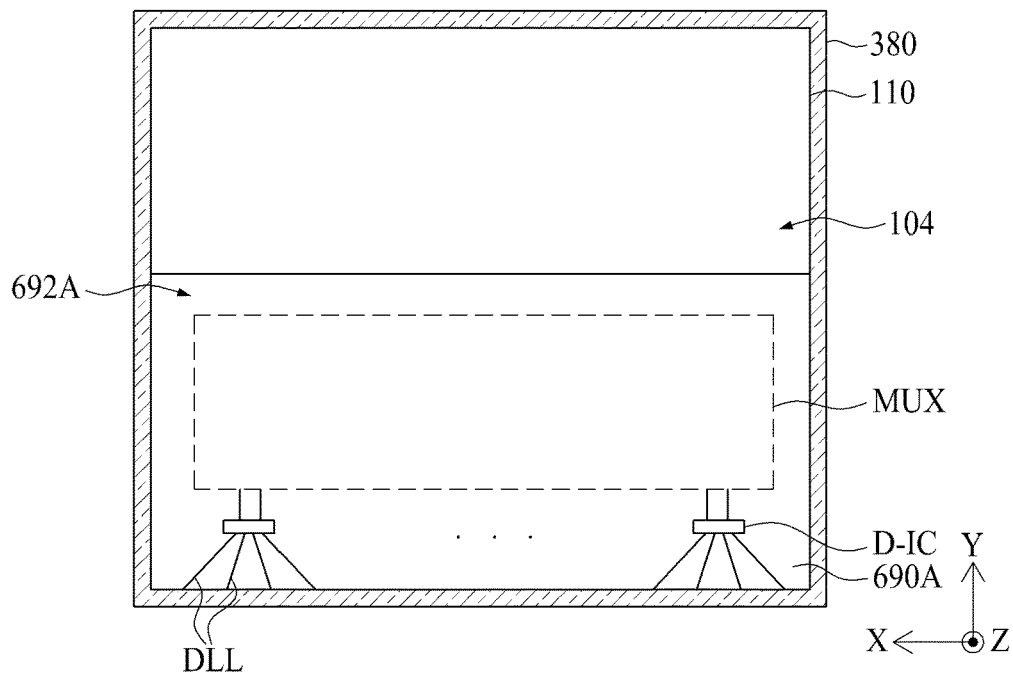
FIG. 6A and FIG. 6B are schematic rear views provided to explain yet another embodiment of a structure of a driving circuit disposed on a surface of a substrate of a display panel.
Figure 6B:
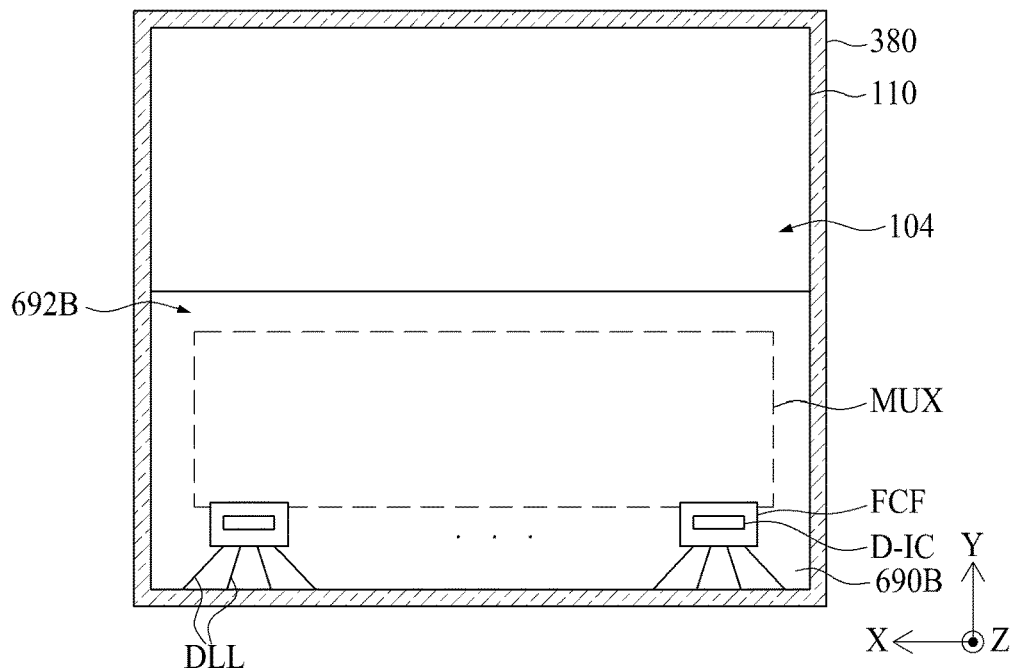

FIG. 6A and FIG. 6B are schematic rear views provided to explain yet another structure of a driving circuit disposed on a substrate of a display panel. The display panels 600A, 600B shown in FIG. 6A and FIG. 6B, respectively, are the same as the display panel 300A shown in FIG. 4A and FIG. 4B except for a structure of the PCB and a size of third substrates 690A, 690B, as well as other differences described below. Each of the third substrates 690A, 690B include a first or rear surface 692A, 692B, respectively. Therefore, redundant description will be omitted.

Referring first to FIG. 6A, the D-IC and a multiplexer (MUX) are disposed on the rear surface 692A of the third substrate 690A. Specifically, the D-IC is mounted on the rear surface 692A of the third substrate 690A by the COG method and the MUX is disposed on the rear surface 692A instead of the PCB.

As with FIG. 5A and FIG. 5B, the G-IC of the display panel 500B may be disposed in the non-active area NA of the first substrate 110 by the GIP method or disposed in the active area AA of the first substrate 110 by the GIA method.

Referring to FIG. 6B, the D-IC and the MUX are disposed on the rear surface 692B of the third substrate 690B. Specifically, the FCF is disposed on the rear surface 692B of the third substrate 690B and the D-IC is disposed on FCF by the COF method. The FCF is connected to the MUX and the D-IC is in electronic communication with the MUX via the FCF.

As with FIG. 6A, the G-IC of FIG. 6B is disposed on the top surface of the first substrate 110.

Referring to FIG. 6A and FIG. 6B, the MUX is disposed directly on the rear surface 692A, 692B of the third substrate 690A, 690B. Thus, the third substrate 690A, 690B may be selected to have a size corresponding to the MUX. Therefore, the third substrate 690A, 690B according to the embodiment shown in FIG. 6A and FIG. 6B may have a smaller size than the third substrate 390 according to the embodiment shown in FIG. 4A and FIG. 4B in which the G-IC is disposed on the rear surface 392 of the third substrate 390. However, the third substrate 690A, 690B according to the embodiment shown in FIG. 6A and FIG. 6B may have a greater size than the third substrate 590A, 590B according to the embodiment shown in FIG. 5A and FIG. 5B in which the separate PCB is disposed on the rear surface 104 of the first substrate 110.

Figure 7A:
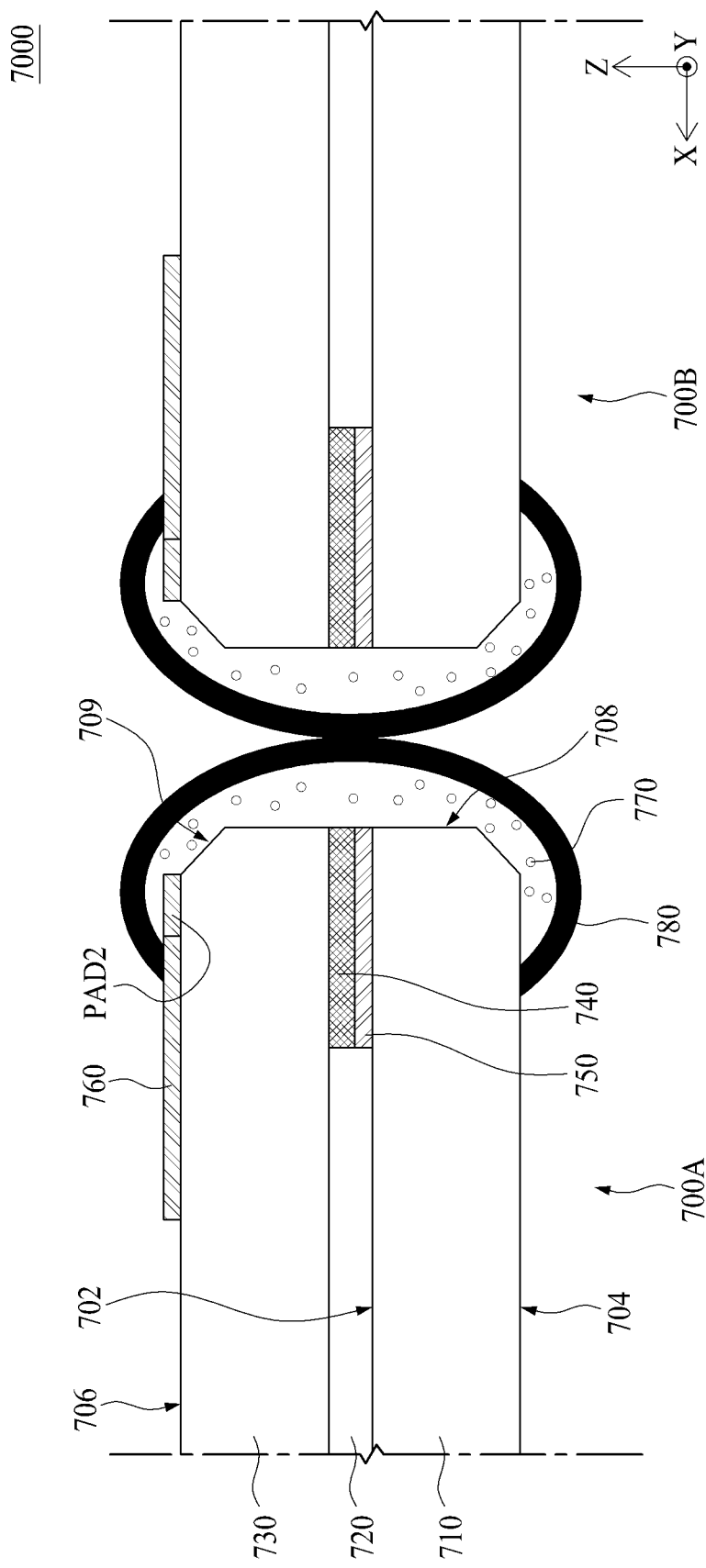
FIG. 7A through FIG. 7D are schematic diagrams provided to explain a multi-panel organic light emitting display device according to yet another embodiment of the present disclosure.
Figure 7B:
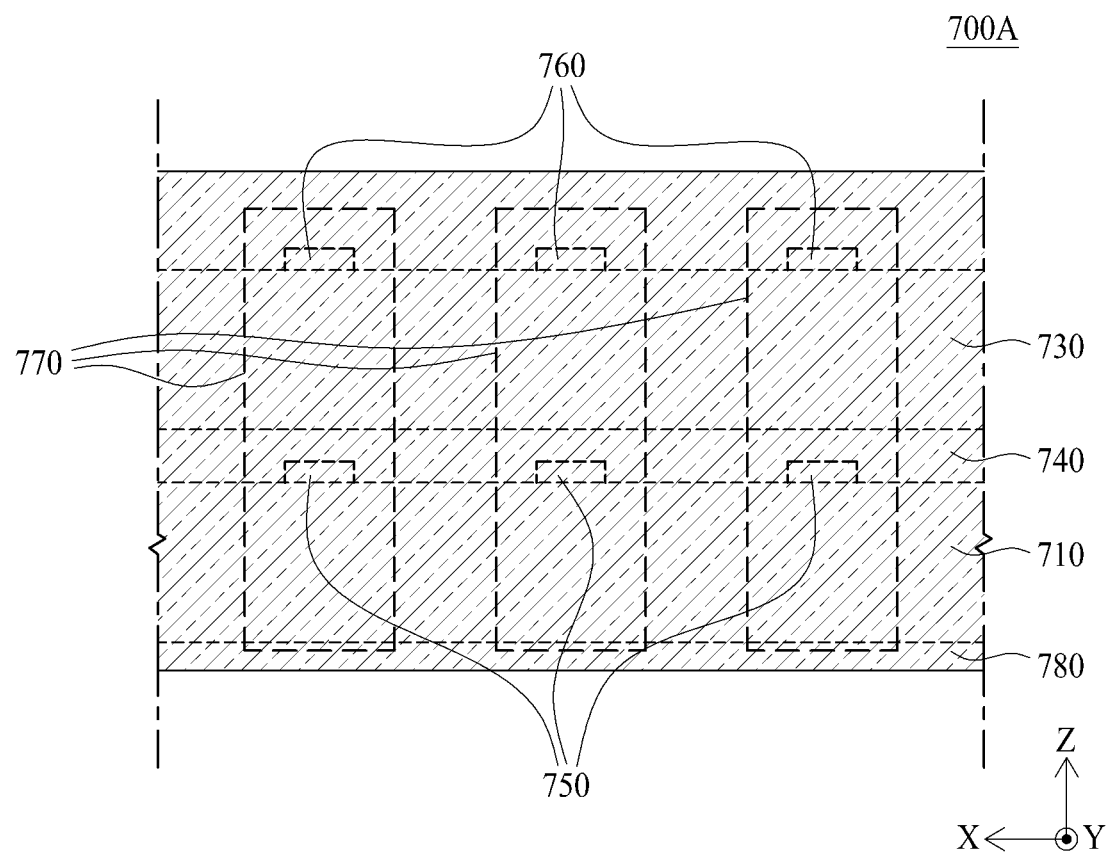
Figure 7C:
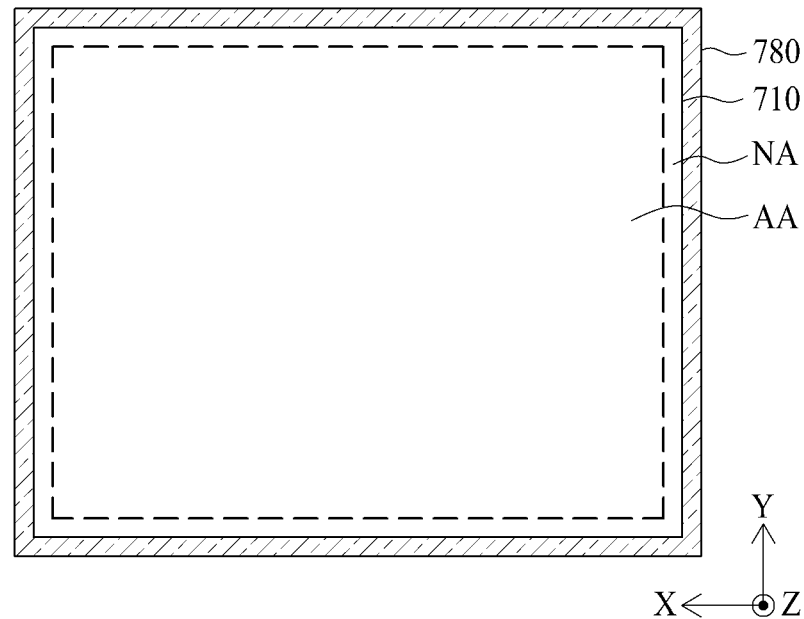
Figure 7D:
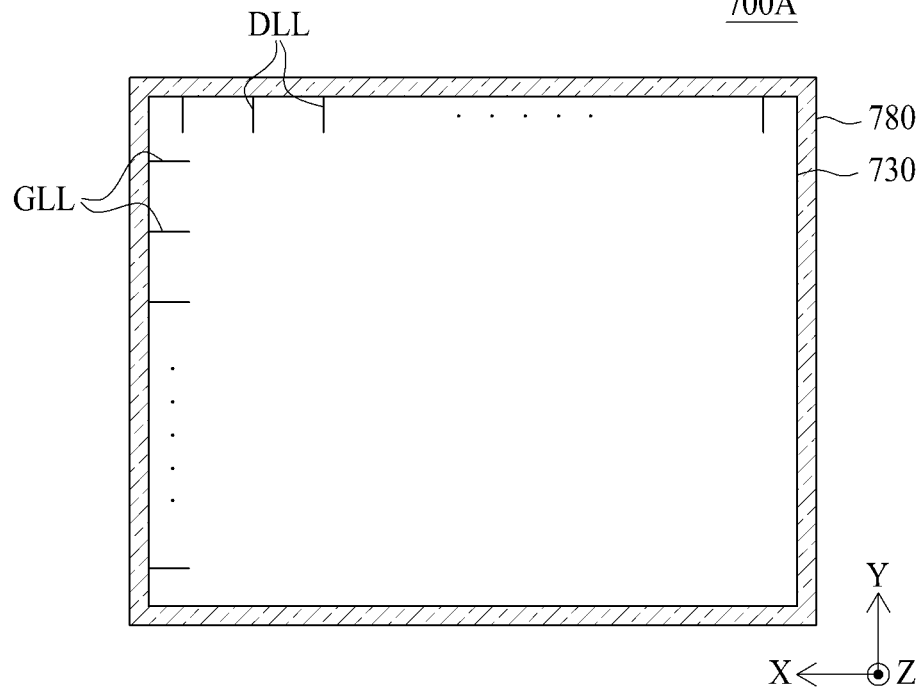

FIG. 7A through FIG. 7D are schematic diagrams provided to explain a multi-panel organic light emitting display device according to yet another embodiment of the present disclosure. Specifically, FIG. 7A is a schematic cross-sectional view of a contact portion between a first display panel 700A and a second display panel 700B included in a multi-panel organic light emitting display device 7000 according to yet another embodiment of the present disclosure. FIG. 7B is a schematic side view of the first display panel 700A shown in FIG. 7A. FIG. 7C is a schematic rear view of a first substrate 710 of the first display panel 700A shown in FIG. 7A. FIG. 7D is a schematic top view of a second substrate 730 of the first display panel 700A shown in FIG. 7A. The multi-panel organic light emitting display device shown in FIG. 7A through FIG. 7D is the same as the multi-panel organic light emitting display device 1000 shown in FIG. 1A through FIG. 1F, except for the differences described below, including that the display panel 700A is of bottom emission type, and, thus, the first substrate 710, the second substrate 730, a plurality of side lines 770, and an insulating layer 780 are configured differently. Therefore, redundant description will be omitted.

Referring to FIG. 7A, the multi-panel organic light emitting display device 7000 according to yet another embodiment of the present disclosure includes the bottom emission display panel 700A and the bottom emission display panel 700B. Specifically, each of the first display panel 700A and the second display panel 700B includes a first substrate 710, a display unit 720 on the first substrate, a second substrate 730 on the display unit 720, a sealant 740 between the first and second substrates 710, 730, a plurality of signal lines 750, a plurality of link lines 760, a plurality of side lines 770, and the insulating layer 780.

The display unit 720 is disposed on a top or first surface 702 of the first substrate 710. Herein, the display panel 700A is of bottom emission type in which light from an organic light emitting element is emitted toward a TFT. Specifically, the TFT may be disposed on the top surface 702 of the first substrate 710, a planarization layer may be disposed on the TFT, and an anode, a plurality of organic layers including an EML and a cathode may be laminated in sequence on the planarization layer. Since the display panel 700A is of bottom emission type, the anode may be formed of a transparent conductive layer and the cathode may be formed of a metal material. In the display panel 700A shown in FIG. 7A, light emitted from the organic light emitting element is reflected by the anode and emitted toward a second or rear surface 704 of the first substrate 710 on which the TFT is disposed.

The second substrate 730 is disposed on the display unit 720 to be opposite to the first substrate 710. The second substrate 730 serves as an encapsulation plate to protect the display unit 720. Unlike the display panel 100A shown in FIG. 1A through FIG. 1F, the plurality of link lines 760 needs to be disposed on a top surface of the second substrate 730. Thus, second substrate 730 may not be an encapsulation layer formed by coating an organic material or an inorganic material but may be formed of preferably high-hardness glass, metal foil, and plastic film.

Referring to FIG. 7A and FIG. 7B, the plurality of signal lines 750 are disposed on the top surface 702 of the first substrate 710. The plurality of link lines 760 are disposed on a first or top surface 706 of the second substrate 730. Further, the plurality of side lines 770 are disposed on side surfaces 708, 710 of the first substrate 710 and the second substrate 730. The plurality of side lines 770 are disposed to cover the rear surface 704 of the first substrate 710, the side surface 708 of the first substrate 710, the side surfaces of the plurality of signal lines 750, the side surface 709 of the second substrate 730, and ends of the plurality of link lines 760 disposed on the top surface 706 of the second substrate 730. That is, the plurality of side lines 770 are disposed to continuously cover the display panel 700A from the rear surface 704 of the first substrate 710 to the plurality of link lines 760 on the top surface 706 of the second substrate 730.

Referring to FIG. 7A through FIG. 7D, the display panel 700A included in the multi-panel organic light emitting display device 7000 according to an embodiment of the present disclosure is of bottom emission type. Even in this configuration, various drivers such as the G-IC or the D-IC and a PCB are disposed on the top surface of the second substrate 730 that protects the display unit 720 instead of on the non-active area NA. Thus, the non-active area NA can be reduced. As a result, with the above-described configuration, a bezel area of the display panel 700A can be reduced.

Hereafter, a link structure between a side line and a signal line or a link line will be described.

Figure 8A:
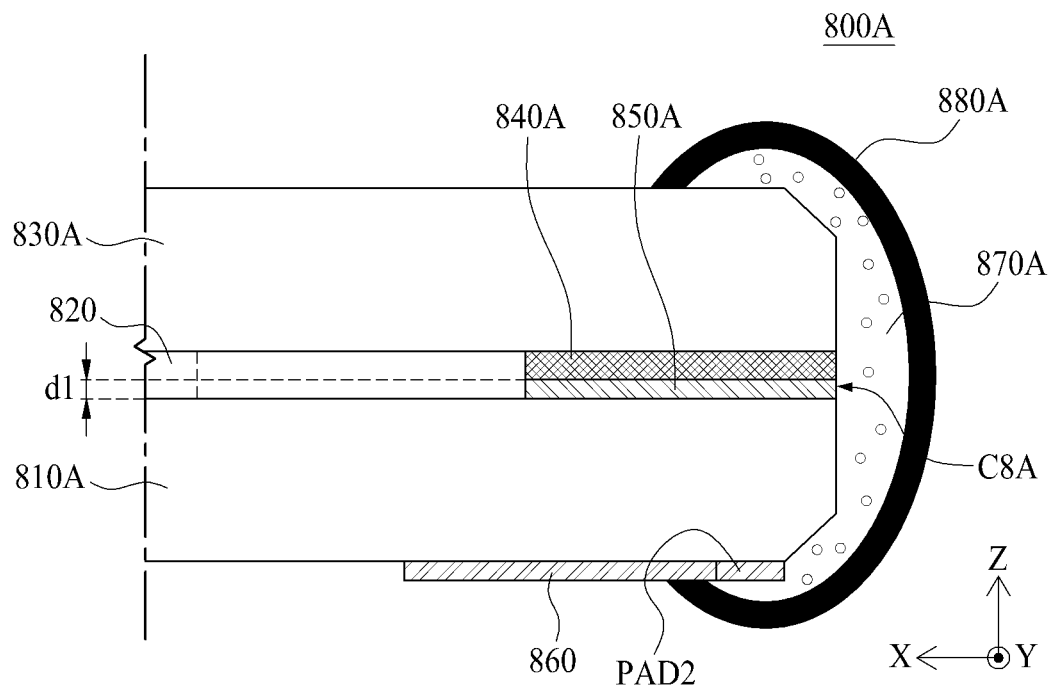
FIG. 8A and FIG. 8B are schematic cross-sectional views provided to explain a link structure between a side line and a signal line in a multi-panel organic light emitting display device including a top emission display panel.
Figure 8B:
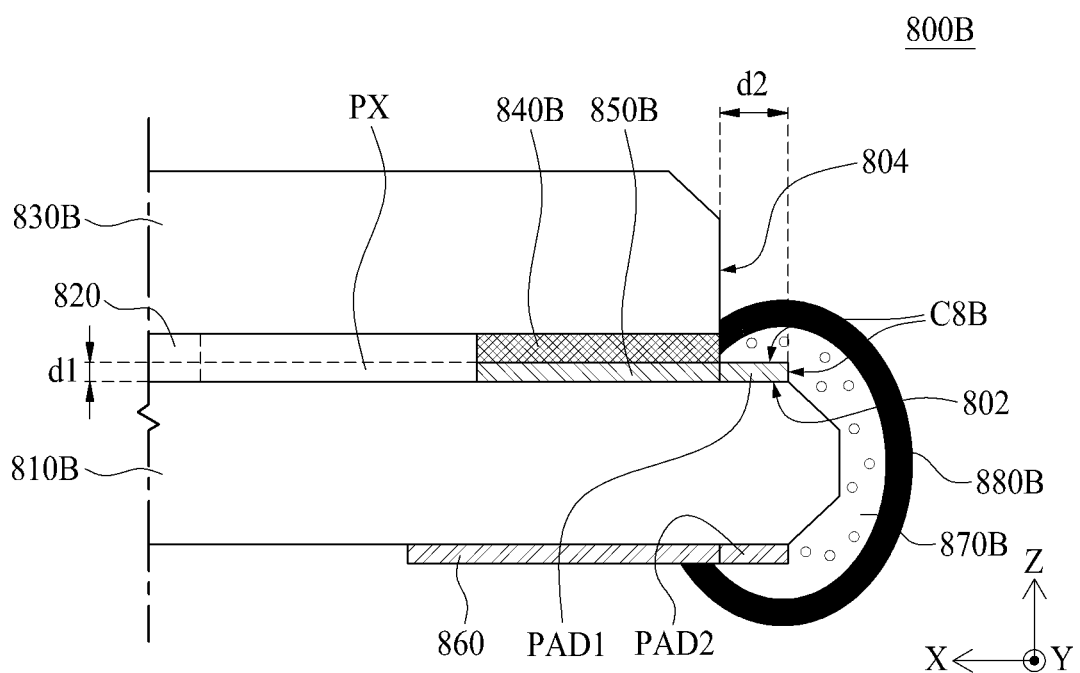

FIG. 8A and FIG. 8B are schematic cross-sectional views provided to explain a link structure between a side line and a signal line in a multi-panel organic light emitting display device including a top emission display panel.

The display panel 800A shown in FIG. 8A has a structure in which there is no step between ends of a first substrate 810A and a second substrate 830A. Thus, side surfaces of a plurality of lines 850A disposed between the first substrate 810A and the second substrate 830A are disposed on the same plane with side surfaces of the first substrate 810A and the second substrate 830A. If there is no step between the ends of the first substrate 810A and the second substrate 830A, a contact area C8A between a side line 870A and a signal line 850A has a size equal to a height d1 of the signal line 850A times a width of the signal line 850A. That is, the contact area C8A between the side line 870A and the signal line 850A is only a side surface of the signal line 850A. Thus, a current transferred to the signal line 850A through the side line 870A may not be sufficient in certain applications.

However, in the display panel 800B shown in FIG. 8B, a first substrate 810B protrudes relative to a second substrate 830B. Thus, there is a step 802 between ends of the first substrate 810B and the second substrate 830B. Due to the step 802 between the first substrate 810B relative to the second substrate 830B, a plurality of signal lines 850B can be disposed on the protruded first substrate 810B that are not under the second substrate 830B. That is, the plurality of signal lines 850B extend beyond a side surface 804 of the second substrate 830B. In this case, top surfaces of the plurality of signal lines 850B are exposed to the outside and may form first pads PAD1 on the step 802.

In FIG. 8B, a plurality of side lines 870B are disposed to cover the exposed top surfaces of the plurality of signal lines 850B, e.g., the first pads PAD1 on the step 802. Thus, a contact area C8B between a side line 870B and a signal line 850B has a size equal to (the sum of a height d1 of the signal line 850B plus a length d2 of the exposed top surface of the signal line 850B) times a width of the signal line 850B. That is, the contact area C8B between the side line 870B and the signal line 850*b* includes a side surface of the signal line 850B as well as the top surface of the signal line 850B exposed due to the step 802 between the first substrate 810B and the second substrate 830B. Thus, the contact area C8B between the side line 870B and the signal line 850B of the display panel shown in FIG. 8B is greater than the contact area C8A between the side line 870A and the signal line 850A of the display panel shown in FIG. 8A. Due to an increase in the contact area, a current transferred to the signal line through the side line can be greatly increased as between FIG. 8A and FIG. 8B. The ability to transfer larger amounts of current enables formation of larger organic light emitting display devices.

Figure 9A:
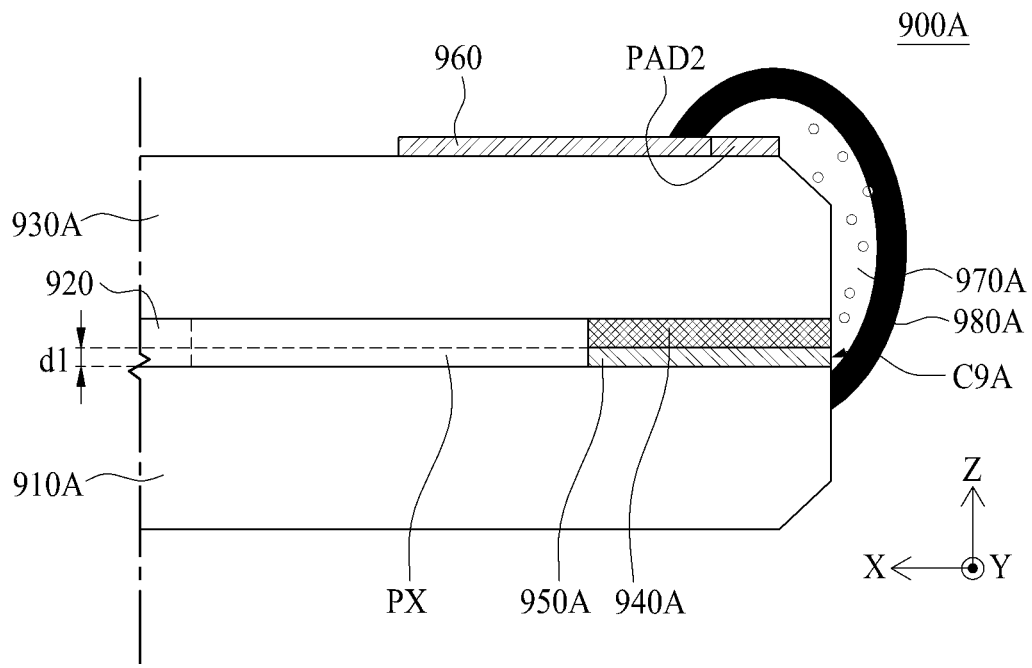
FIG. 9A and FIG. 9B are schematic cross-sectional views provided to explain a link structure between a side line and a signal line in a multi-panel organic light emitting display device including a bottom emission display panel.
Figure 9B:
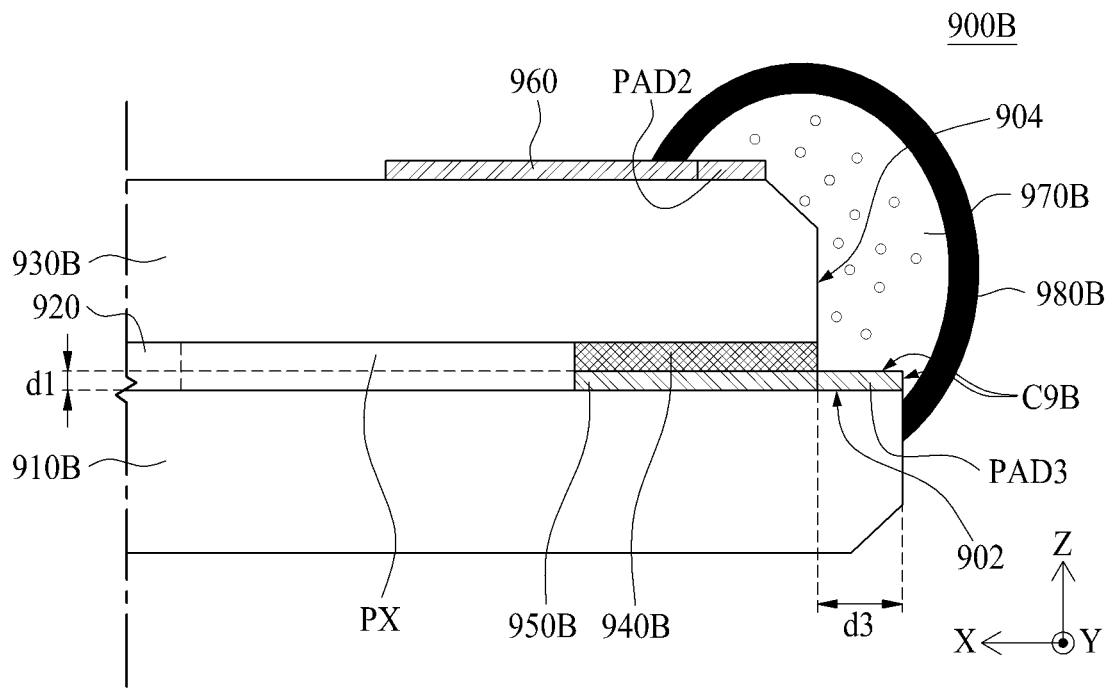

FIG. 9A and FIG. 9B are schematic cross-sectional views provided to explain a link structure between the side line 170 and the signal line 150 in the multi-panel organic light emitting display device 1000 including the bottom emission display panel 100A.

The display panel 900A shown in FIG. 9A has a structure in which there is no step between ends of a first substrate 910A and a second substrate 930A. As described above with reference to FIG. 8A, if there is no step between the ends of the first substrate 910A and the second substrate 930A, a contact area C9A between a side line 970A and a signal line 950A has a size equal to a height d1 of the signal line 950A times a width of the signal line 950A. That is, the contact area C9A between the side line 970A and the signal line 950A is only a side surface of the signal line 950A. Thus, a current transferred to the signal line 950A through the side line 970A may not be sufficient for certain applications, such as for large organic light emitting displays.

However, in the display panel 900B shown in FIG. 9B, a first substrate 910B is protruded relative to a second substrate 930B. Thus, there is a step 902 between ends of the first substrate 910B and the second substrate 930B. Due to the step 902 between the first substrate 910B and the second substrate 930B, a plurality of signal lines 950B disposed on the step 902 extend beyond a side surface 904 of the second substrate 930B. In this case, top surfaces of the plurality of signal lines 950B are exposed and form third pads PAD3.

In this embodiment, a plurality of side lines 970B are disposed to cover the exposed top surfaces of the plurality of signal lines 950B, e.g., the third pads PAD3. Thus, a contact area C9B between a side line 970B and a signal line 950B has a size equal to (the sum of a height d1 of the signal line 950B plus a length d3 of the exposed top surface of the signal line 950B)×a width of the signal line 950B. That is, the contact area C9B between the side line 970B and the signal line 950B includes a side surface of the signal line 950B as well as the top surface of the signal line 950B exposed due to the step 902 between the first substrate 910B and the second substrate 930B. Thus, the contact area C9B between the side line 970B and the signal line 950B of the display panel 900B shown in FIG. 9B is greater than the contact area C9A between the side line 970A and the signal line 950A of the display panel 900A shown in FIG. 9A. Due to an increase in the contact area, a current transferred to the signal line through the side line can be greatly increased. An increase in the current transferred enables formation of large organic light emitting display devices.

In the embodiments shown in FIG. 9A and FIG. 9B, insulating layer 980A, 980B does not extend from beneath the first substrate 910A, 910B to a plurality of link lines 960 on a top surface of the second substrate 930A, 930B. Rather, the insulating layer 980A, 980B extends from a side surface of the first substrate 910A, 910B to the plurality of link lines

960. Thus, a portion of the side surface of the first substrate 910A, 910B remains exposed and uncovered by insulating layer 980A, 980B.

The exemplary embodiments of the present disclosure can also be described as follows:

According to an aspect of the present disclosure, there is provided a multi-panel organic light emitting display device. The multi-panel organic light emitting display device comprises a plurality of display panels disposed to be adjacent to each other. Each of the plurality of display panels includes a base substrate including an active area and a non-active area surrounding the active area, a display unit including an organic light emitting element disposed on a top surface of the base substrate, a plurality of signal lines disposed on the top surface of the base substrate and electrically connected to the display unit, a plurality of link lines disposed under the base substrate, a plurality of side lines disposed on a side surface of the base substrate and connecting the plurality of signal lines and the plurality of link lines, and a driving circuit disposed under the base substrate and electrically connected to the plurality of link lines.

The plurality of side lines may include a patterned metal layer to connect the plurality of signal lines and the plurality of link lines, respectively.

The multi-panel organic light emitting display device may further comprise an insulating layer covering the plurality of side lines, and the insulating layer may contain a black material.

The insulating layer may be prepared as a single layer to surround the entire side surface of the base substrate and cover all of the plurality of side lines.

The insulating layer may include a plurality of insulating patterns corresponding to the plurality of side lines, respectively.

The plurality of link lines and the driving circuit may be disposed on a rear surface of the base substrate, and the driving circuit may include at least one of a gate driving integrated circuit and a data driving integrated circuit.

The multi-panel organic light emitting display device may further comprise an auxiliary substrate bonded to a lower side of the base substrate, and the plurality of side lines may be disposed to cover side surfaces of the plurality of signal lines, the base substrate, the auxiliary substrate, and the plurality of link lines.

The driving circuit may include a gate driving integrated circuit and a data driving integrated circuit, and the plurality of link lines and the driving circuit may be disposed on a rear surface of the auxiliary substrate, the plurality of link lines may include a plurality of gate link lines connected to the gate driving integrated circuit and a plurality of data link lines connected to the data driving integrated circuit, and the plurality of signal lines may include a plurality of gate lines electrically connected to the plurality of gate link lines and a plurality of data lines electrically connected to the plurality of data link lines.

The driving circuit may include a gate driving integrated circuit and a data driving integrated circuit, and the gate driving integrated circuit may be disposed on the top surface of the base substrate, and the data driving integrated circuit may be disposed on a rear surface of the auxiliary substrate, the plurality of link lines may include a plurality of data link lines connected to the data driving integrated circuit, the plurality of signal lines may include a plurality of data lines electrically connected to the plurality of data link lines, and the auxiliary substrate may have a smaller size than the base substrate.

The plurality of side lines may be in direct contact with side surfaces of the plurality of signal lines and the plurality of link lines.

The multi-panel organic light emitting display device may further comprise an encapsulation substrate disposed on the display unit to be opposite to the base substrate, and the base substrate may be more protruded to the outside than the encapsulation substrate and the plurality of signal lines may be disposed on the protruded base substrate, and the plurality of side lines may be disposed to be in contact with exposed top surfaces and side surfaces of the plurality of signal lines.

The plurality of display panels may include a first display panel and a second display panel adjacent to each other, and the distance between pixels disposed in the first display panel may be equal to the distance between outermost adjacent pixels of the first display panela and the second display panel.

According to another aspect of the present disclosure, there is provided a multi-panel organic light emitting display device. The multi-panel organic light emitting display device comprises a plurality of display panels disposed to be adjacent to each other. Each of the plurality of display panels includes a base substrate including an active area and a non-active area surrounding the active area, a display unit including an organic light emitting element disposed on a top surface of the base substrate, an encapsulation substrate disposed on the display unit to be opposite to the base substrate, a plurality of signal lines disposed on the top surface of the base substrate and electrically connected to the display unit, a plurality of link lines disposed on a top surface of the encapsulation substrate and connected to a driving circuit, and a plurality of side lines disposed on a side surface of the base substrate and connecting the plurality of signal lines and the plurality of link lines.

The display unit may include a thin film transistor disposed on the base substrate and an organic light emitting element disposed on the thin film transistor, and the organic light emitting element may include an anode made of a transparent conductive material, a plurality of organic layers including an emitting layer, and a cathode made of a metal material.

The plurality of side lines may include a patterned metal layer to connect the plurality of signal lines and the plurality of link lines, respectively.

The multi-panel organic light emitting display device may further comprise an insulating layer covering the plurality of side lines, and the insulating layer may contain a black material.

The plurality of side lines may be in direct contact with side surfaces of the plurality of signal lines and the plurality of link lines.

The base substrate may be more protruded to the outside than the encapsulation substrate and the plurality of signal lines may be disposed on the protruded base substrate, and the plurality of side lines may be disposed to be in contact with exposed top surfaces and side surfaces of the plurality of signal lines.

The plurality of display panels may include a first display panel and a second display panel adjacent to each other, and the distance between pixels disposed in the first display panel may be equal to the distance between outermost adjacent pixels of the first display panela and the second display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate including an active area,
a plurality of pixels in the active area, each of the pixels of the plurality being spaced a selected distance apart from an adjacent pixel of the plurality; and
a gate driving circuit disposed between the plurality of pixels in the active area,
wherein each of the plurality of pixels include an emission area including an organic light emitting layer, and
wherein a distance between a side surface of the substrate and the emission area of an outermost pixel among the plurality of pixels is either equal to or smaller than half of the selected distance between the adjacent pixels.

2. The display device of claim 1, further comprising an encapsulation layer on the plurality of pixels,
wherein the encapsulation layer is configured to protect the organic light emitting layer from a moisture.

3. The display device of claim 1, further comprising:
side lines disposed at least partially on a side surface of the substrate; and
an insulating layer at least partially covering the side lines.

4. The display device of claim 3, wherein the insulating layer is a single layer extending over an entire side surface of the substrate over all of the side lines.

5. The display device of claim 3, wherein the insulating layer includes a plurality of insulating patterns corresponding to the side lines, respectively.

6. The display device of claim 1, further comprising a plurality of gate lines configured to be electrically connected to the plurality of pixels,
wherein the gate driving circuit is configured to be electrically connected to each of the plurality of gate lines into the active area.

7. The display device of claim 1, further comprising a plurality of pad disposed in an area between the side surface of the substrate and the emission area of the outermost pixel.

8. A display device, comprising:
a substrate having thereon a plurality of pixels;
a gate driving circuit disposed between the plurality of pixels; and
an insulating layer at least partially covering a side surface of the substrate,
wherein each of the plurality of pixels include an emission area including an organic light emitting layer,
wherein an outermost pixel of the plurality of pixels is immediately adjacent to the insulating layer, and
wherein a distance between the emission area of the outermost pixel and an outermost end of the insulating layer is equal to half of a distance between adjacent pixels of the plurality of pixels.

9. The display device of claim 8, further comprising an encapsulation layer on the plurality of pixels, wherein the encapsulation layer is configured to protect the organic light emitting layer from a moisture.

10. The display device of claim 8, wherein a distance between the side surface of the substrate and the emission area of the outermost pixel is smaller than a half of the distance between the adjacent pixels.

11. The display device of claim 8, further comprising:
side lines at least partially on the side surface of the substrate,
wherein the insulating layer at least partially covers the side lines.

12. The display device of claim 11, further comprising:
an auxiliary substrate on a rear surface of the substrate;
an adhesive layer between the substrate and the auxiliary substrate; and
link lines on a rear surface of the auxiliary substrate,
wherein the side lines are on the side surface of the substrate and a side surface of the auxiliary substrate, and are configured to be electrically connected to the link lines.

13. The display device of claim 12,
wherein the insulating layer is a single layer extending over an entire side surface of the side surface of the substrate and the auxiliary substrate and covering all of the side lines.

14. The display device of claim 12, wherein the insulating layer further covers an edge of a front surface of the substrate and an edge of a rear surface of the auxiliary substrate.

15. The display device of claim 8, further comprising a plurality of gate lines configured to be electrically connected to the plurality of pixels,
wherein the gate driving circuit is configured to be electrically connected to each of the plurality of gate lines into the active area.

16. The display device of claim 8, further comprising a plurality of pad disposed in an area between the side surface of the substrate and the emission area of the outermost pixel.

17. The display device of claim 16, wherein an area of the outermost pixel includes one or more of the plurality of pad.

18. A multi-panel organic light emitting display device, comprising:
a plurality of display panels arranged in a form of a tile array,
wherein each of the plurality of display panels comprising:
a substrate including an active area, a plurality of pixels in the active area, each of the pixels of the plurality being spaced a selected distance apart from an adjacent pixel of the plurality; and a gate driving circuit disposed between the plurality of pixels in the active area, wherein each of the plurality of pixels include an emission area including an organic light emitting layer, and wherein a distance between a side surface of the substrate and the emission area of an outermost pixel among the plurality of pixels is smaller than half of the selected distance between the adjacent pixels of the plurality of pixels.

19. A multi-panel organic light emitting display device, comprising:

a first display panel including an active area configured on a substrate to display an image; and a second display panel adjacent to the first display panel and including an active area configured on a substrate to display an image, wherein each of the first display panel and the second display panel includes:

a plurality of pixels in the active area, each of the pixels of the plurality being spaced a selected distance apart from an adjacent pixel of the plurality; and a gate driving circuit disposed between the plurality of pixels in the active area, wherein each of the plurality of pixels is spaced from adjacent pixels at a pitch and is configured to include an emission area including an organic light emitting layer, wherein in each of the first display panel and the second display panel, a distance between a side surface of the substrate and the emission area of an outermost pixel among the plurality of pixels is smaller than half of the selected distance between the adjacent pixels, and wherein a distance between the outermost pixel of the first display panel and a corresponding outermost pixel of the second display panel is equal to the pitch between the adjacent pixels.

20. The multi-panel organic light emitting display device of claim 19, wherein the emission area is configured to have a length and a width that is substantially identical to the length, and wherein the pitch between the pixels is a sum of the distance between outermost pixels of the first display panel and the second display panel and the length of the emission area.

21. The multi-panel organic light emitting display device of claim 19, wherein each of the first display panel and the second display panel further includes:

side lines at least partially on a side surface of the substrate; and an insulating layer at least partially covering the side lines.

22. The multi-panel organic light emitting display device of claim 19, further comprising a plurality of gate lines configured to be electrically connected to the plurality of pixels, wherein the gate driving circuit is configured to be electrically connected to each of the plurality of gate lines into the active area.

* * * * *